United States Patent [19]
Shinriki et al.

[11] Patent Number: 5,834,846
[45] Date of Patent: Nov. 10, 1998

[54] SEMICONDUCTOR DEVICE WITH CONTACT STRUCTURE AND METHOD OF MANUFACTURING THE SAME

[75] Inventors: Hiroshi Shinriki; Takayuki Komiya, both of Chiba; Hiroshi Yamamoto, Tokyo, all of Japan

[73] Assignee: Kawasaki Steel Corporation, Kobe, Japan

[21] Appl. No.: 518,322

[22] Filed: Aug. 23, 1995

[51] Int. Cl.$^6$ .......................... H01L 23/48; H01L 23/52; H01L 29/40

[52] U.S. Cl. .......................... 257/754; 257/751; 257/757; 257/763; 257/768; 257/770

[58] Field of Search .................................. 257/754, 757, 257/763, 751, 768, 770, 767

[56] References Cited

U.S. PATENT DOCUMENTS

| | | |
|---|---|---|
| 4,502,210 | 3/1985 | Okumura et al. . |
| 4,701,349 | 10/1987 | Koyanagi et al. . |
| 4,740,483 | 4/1988 | Tobin . |
| 4,772,571 | 9/1988 | Scovell et al. . |
| 4,784,973 | 11/1988 | Stevens et al. . |
| 4,851,369 | 7/1989 | Ellwanger et al. . |
| 4,871,691 | 10/1989 | Torres et al. . |
| 4,904,620 | 2/1990 | Schmitz . |
| 4,944,836 | 7/1990 | Beyer et al. . |
| 5,043,300 | 8/1991 | Nulman . |
| 5,104,694 | 4/1992 | Saito et al. . |
| 5,141,897 | 8/1992 | Manocha et al. . |
| 5,187,120 | 2/1993 | Wang . |
| 5,200,639 | 4/1993 | Ishizuka et al. . |
| 5,209,816 | 5/1993 | Yu et al. . |
| 5,217,756 | 6/1993 | Shinzawa . |
| 5,231,056 | 7/1993 | Sandhu . |
| 5,270,254 | 12/1993 | Chen et al. . |
| 5,272,666 | 12/1993 | Tsang et al. . |
| 5,273,775 | 12/1993 | Dyer et al. . |
| 5,288,665 | 2/1994 | Nulman . |
| 5,330,921 | 7/1994 | Yoshida et al. . |
| 5,344,792 | 9/1994 | Sandhu et al. . |

FOREIGN PATENT DOCUMENTS

| | | |
|---|---|---|
| 1275332 | 10/1990 | Canada . |
| 0 097 848 | 1/1984 | European Pat. Off. . |
| 0 286 182 | 10/1988 | European Pat. Off. . |
| 0 448 276 A2 | 9/1991 | European Pat. Off. . |
| 62-098642 | 5/1987 | Japan . |
| 62-105422 | 5/1987 | Japan . |
| 63-33569 | 2/1988 | Japan . |
| 63-55932 | 3/1988 | Japan . |
| 3-110838 | 10/1991 | Japan . |
| 4-320029 | 11/1992 | Japan . |

OTHER PUBLICATIONS

"Formation of Texture Controlled Aluminum and Its Migration Performance in Al–SI/TiN Stacked Structure", M. Kageyama et al., 1991, pp. 97–101.

"Fully Self–Aligned Metallization by Selective Al–CVD and Rapid Thermal Annealing Processes", Yokoyama et al., Extended Abstracts (the 42nd Spring Meeting, 1995); The Japan Society of Applied Physics and Related Societies, p. 815.

(List continued on next page.)

*Primary Examiner*—Sara W. Crane
*Assistant Examiner*—Phat X. Cao
*Attorney, Agent, or Firm*—Oliff & Berridge, PLC

[57] ABSTRACT

A semiconductor device with a contact structure includes a silicon substrate, a diffusion region formed in a surface of the silicon substrate, a silicide film of a high melting point metal deposited on the diffusion region, an insulating film formed on the silicon substrate, a contact hole formed in the insulating film such that the silicide film is exposed at a bottom of the contact hole, an anti-diffusion film formed on at least the exposed surface of the silicide film at the bottom of the contact film, a plug formed in the contact hole by selective Al—CVD, and a metal wiring formed on the insulating film. The metal wiring is electrically connected to the diffusion region by the plug, the anti-diffusion film and the silicide film. The anti-diffusion film is formed by nitriding the surface of the silicide film such that only the grain boundaries of the grains of the silicide film are nitrided.

69 Claims, 26 Drawing Sheets

OTHER PUBLICATIONS

"$CIF_3$ pre-cleaning in selective AL-CVD", J.H. Chung et al., Extended Abstracts (the 42nd Spring Meeting, 1995); The Japan Society of Applied Physics and Related Societies, p. 733.

"Self-Aligned Rapid Thermal Nitridation of $TiSi_2$ in $NH_3$ Ambient as a Diffusion Barrier Layer for Selective CVD-Al Contact Plug Formation", Hiroshi Shinriki et al., Jpn. J. Appl. Phys. vol. 34(1995), pp. 992–996, Part 1, No. 2B, Feb. 1995.

"Selective CVD-Al Contact Plug on Rapid Thermal Processed $TiSi_2$ in $NH_3$ for High Speed CMOS Using Salicide Process", Hiroshi Shinriki et al., Extended Abstracts of the 1994 International Conference on Solid State Devices and Materials, Yokohama, 1994, pp. 946–948.

"CVD Aluminum For Submicron VLSI Metallization", W.Y-C. Lai et al., VMIC Conference, Jun. 11–12, 1991, pp. 89–95.

"Improvement of the Interface between Selectively Deposited Al and Si by Annealing", K. Tani et al., Extended Abstracts of the 1993 International Conference on Solid State Devices and Materials, Makuhari, 1993, pp. 543–545.

"Characterization of LPCVD Aluminum for VLSI Processing", R.A. Levy et al., J. Chemical Soc., Solid State Science and Technology, Sep. 1984, pp. 2175–2182.

"Self-Aligned $TiN_xO_y/TiSi_2$ contact formation", Y.H. Ku et al., Thin Solid Films 172 (1989) 1 14 Electronics and Optics, pp. 1–15.

"Stable, self-aligned $TiN_xO_y/TiSi_2$ contact formation for submicron device applications", Y.H. Ku, et al., Appl.Phys. Lett. 50(22) Jun. 1, 1987, pp. 1598–1600.

"In situ investigation of TiN formation on top of $TiSi_2$", M.F.C. Willemsen et al. J.Vac. Sci.Technol. B6(1), Jan./Feb. 1988, pp. 53–61.

"Novel Submicrometer MOS Devices by Self-Aligned Nitridation of Silicide", Hiroki Kaneko et al. IEEE Transactions on Electron Devices, vol. ED–33, No. 11, Nov. 1986, pp. 1702–1709.

"Self-aligned titanium silicide device technology by $NH_3$ plasma assisted thermal annealing", B-Z Li et al., J.Vac. Sci.Technol. B5(6), Nov./Dec. 1987, pp. 1667–1673.

"The Properties of Al-Cu/Ti Films Sputter Deposited at Elevated Temperatures and High DC Bias", T. Hariu et al., Fujitsu Limited, Bipolar Process Engineering Division, pp. 210–214, 1989.

"Selective Growth of Aluminum Using a Novel CVD System", T. Amazawa et al., International Electron Devices Meeting, 1988, pp. 88–441–88–445.1988.

"Using Transition Metal Conducting Oxides to Prevent Conductivity Degradation of Submicron Wiring At High Temperatures", IBM Technical Disclosure Bulletin, vol. 31, No. 2, Jul. 1988, pp. 16–18.

"A Low Parasitic Capacitance Scheme by Thermally Stable Titanium Silicide Technology for High Speed CMOS", Takehito Yoshida et al., Extended Abstracts of the 1993 International Conference on Solid State Devices and Materials, 1993, pp. 567–569.

"Planarized Aluminum Metallization For Sub–0.5$\mu$m CMOS Technology", F.S. Chen et al., 1990 IEEE, pp. 3.4.1–3.4.4.

"Novel Self-Aligned W/TiN/$TiSi_2$ contact structure for very shallow junctions and interconnections", R.V. Joshi, et al., Appl. Phys. Lett. 54(17), Apr. 24, 1989, pp. 1672–1674.

"Selective Titanium Silicide Chemical Vapor Deposition with Surface Cleaning by sliane and Ohmic Contact Formation to Very Shallow Junctions", Kunio Saito et al., J. Electrochem. Soc., vol. 140, No. 2, Feb. 1993, pp. 513–518.

"Silicon Processing For the VLSI Era, vol. 2, Process Integration", Stanley Wolf, PhD., 1990, pp. 116, 117, 120–123, 128–133, 164–167, 238, 239, 250–255.

Selective Aluminum Chemical Vapor Deposition:, K. Tsubouchi et al., Journal of Vacuum Science and Technology: Part A, vol. 10, No. 4, Jul. 1992, New York US pp. 856–862.

"Formation of TiN/$TiSi_2$/p + –Si/n –Si by Rapid Thermal Annealing Silicon Implanted With Boron Through Titanium", M. Delfino et al., IEEE Electron Device Letters, vol. EDL–6, No. 11, Nov. 1985, pp. 6–8.

"Novel Oxygen Free Titanium Silicidation (OFS) Processing for Low Resistance and Thermally Stable Salicide in Deep Submicron Dual Gate CMOS", H. Kotaki, et al., Extended Abstracts of the 1994 International Conference on Solid State Devices and Materials, Yokohama, 1994, Aug. 23–26, pp. 628–630.

"Direct Formation of Selective CVD-Al Contact Plug on Titanium Silicide Obtained by Silicidation of Titanium Including Nitrogen", T. Komiya et al., Extended Abstracts of the 1995 International Conference on Solid State Devices and Materials, Osaka, 1995, Aug. 21–24, pp. 315–317.

"Novel Submicrometer MOS Devices by Self-Aligned Nitridation of Silicide", H. Kaneko et al., IEEE Transactions on Electron Devices, vol. ED–33, pp. 1702–1709.

The Use of $TiSi_2$ For Self Aligned Silicide (Salicide) Technology, C.Y. Ting et al., Jun. 25–26, 1985 V–Mic Conf., pp. 307–318.

"Use of Chem-Mech Polishing to Enhance Selective CVD-W", IBM Technical Disclosure Bulletin, vol. 34, No. 7B, Dec. 1991, p. 87.

"High Performance CMOS with Oxidation-Planarized Twin Tubs and One-Mask Sealed Diffusion-Junctions", C.T. Liu, 1993 IEEE, pp. 93–347–93–441.

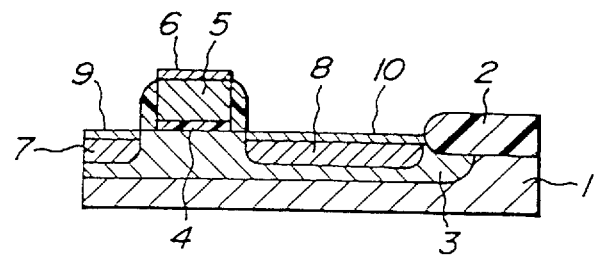
FIG_1A
PRIOR ART
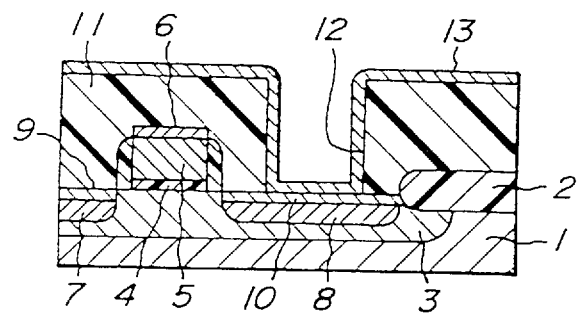
FIG_1B
PRIOR ART
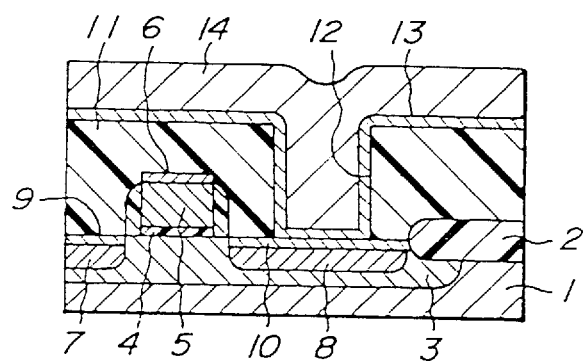
FIG_1C
PRIOR ART
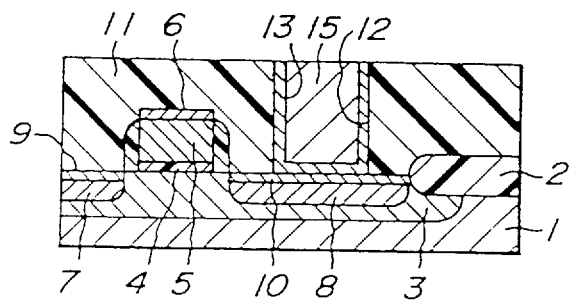
FIG_1D
PRIOR ART

FIG_2
PRIOR ART
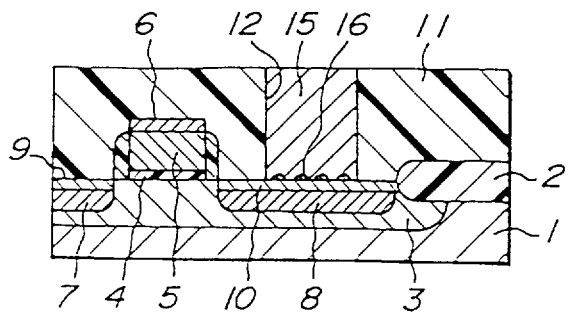
FIG_3A
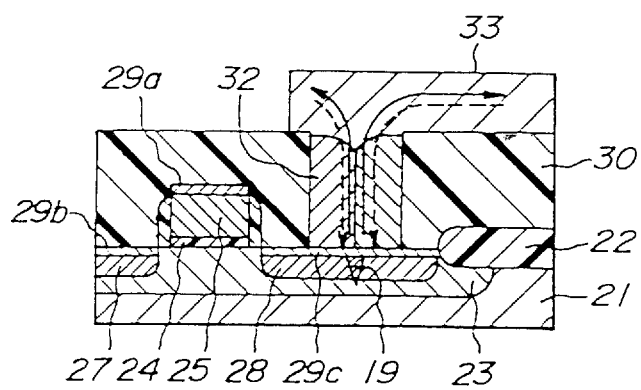
FIG_3B
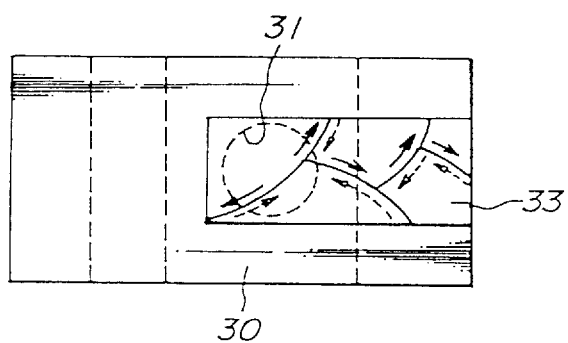

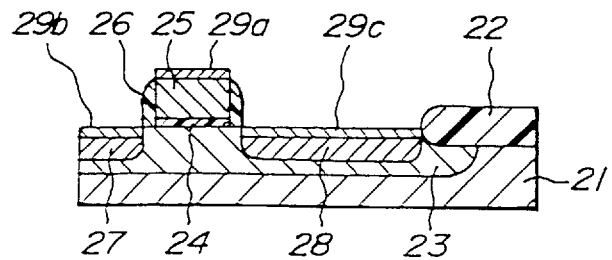
FIG_4A
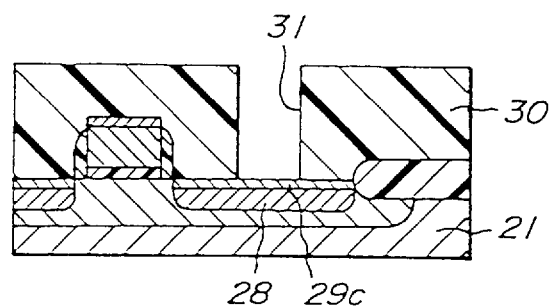
FIG_4B
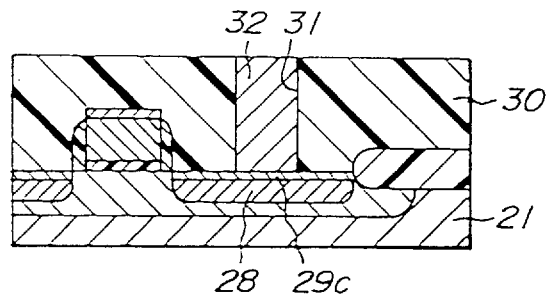
FIG_4C
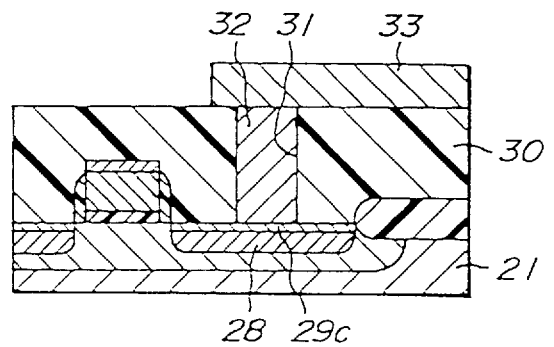
FIG_4D

FIG_5
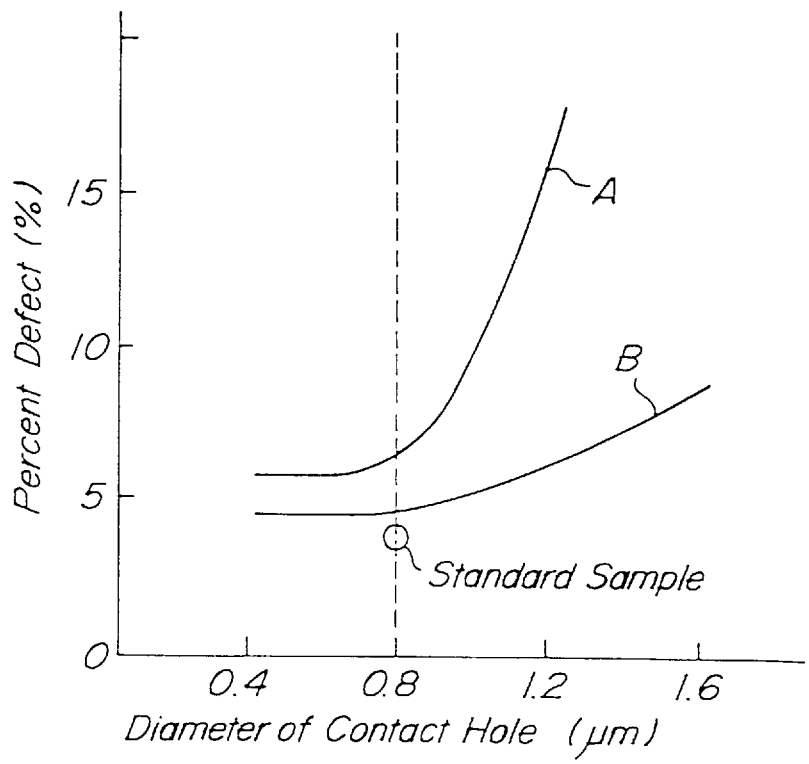
FIG_6A
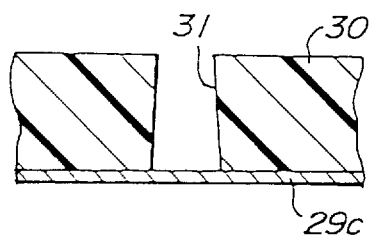
FIG_6B
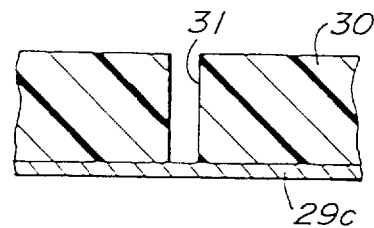

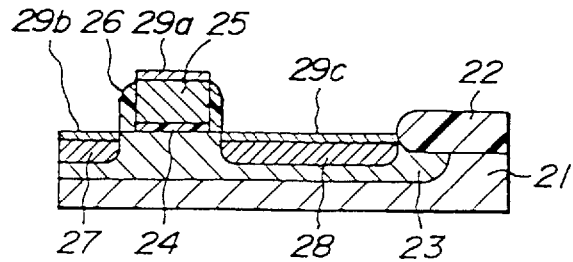
FIG_7A
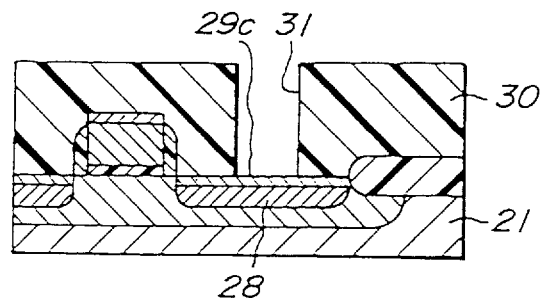
FIG_7B
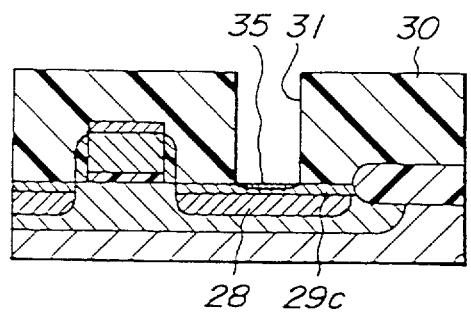
FIG_7C
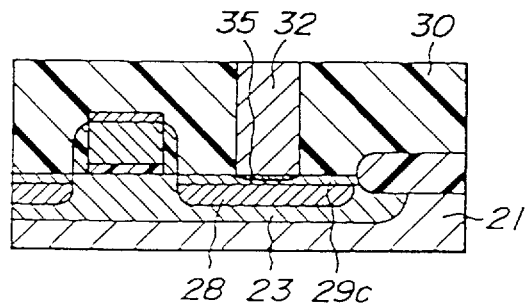
FIG_7D

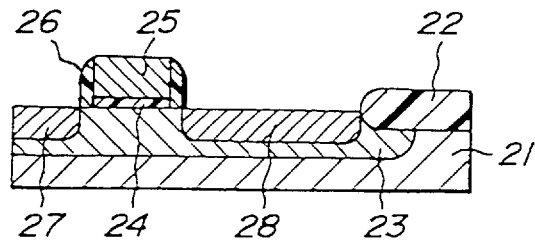
FIG_8A
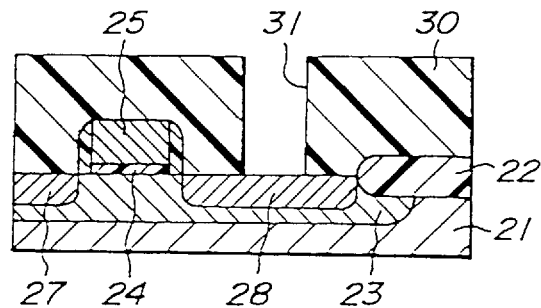
FIG_8B
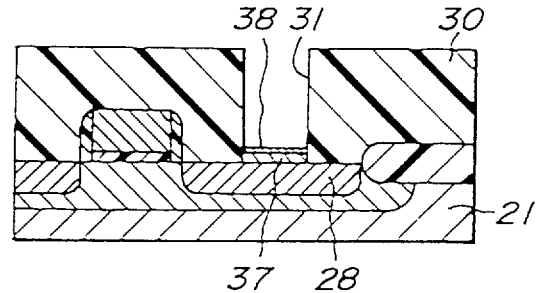
FIG_8C
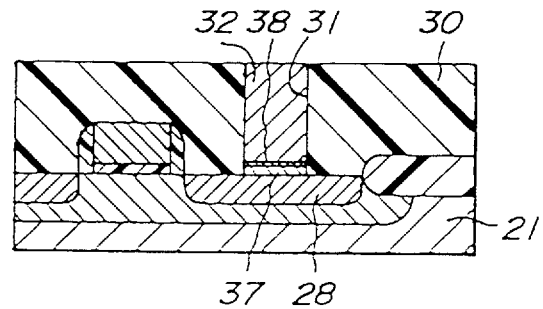
FIG_8D

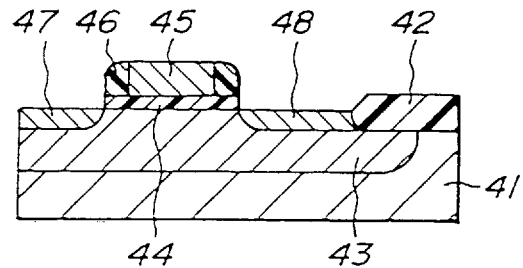
FIG_9A
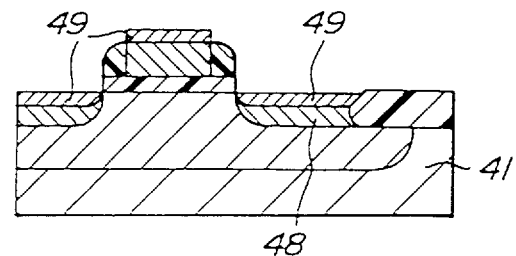
FIG_9B
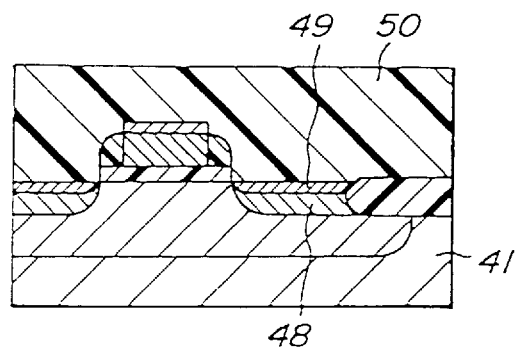
FIG_9C
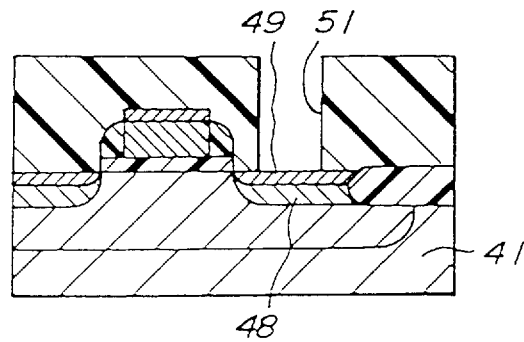
FIG_9D

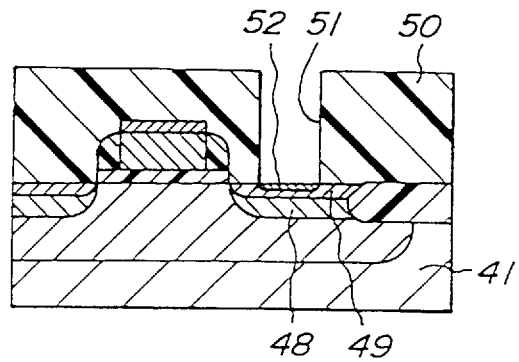
FIG_9E
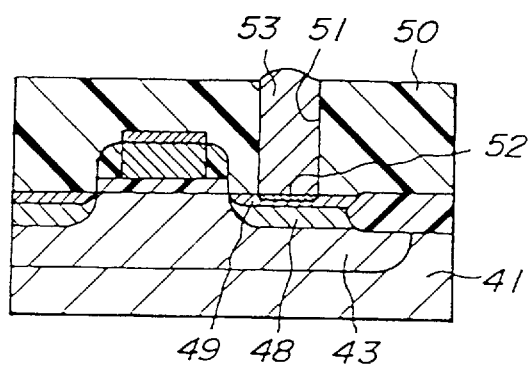
FIG_9F
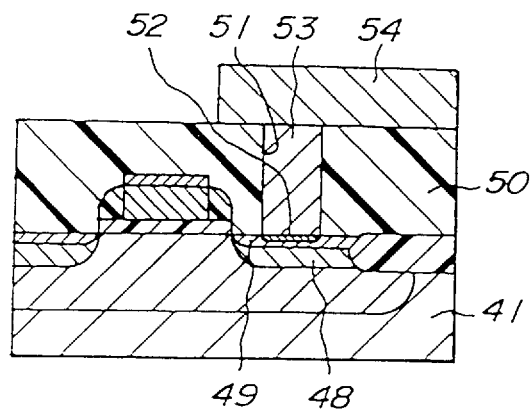
FIG_9G

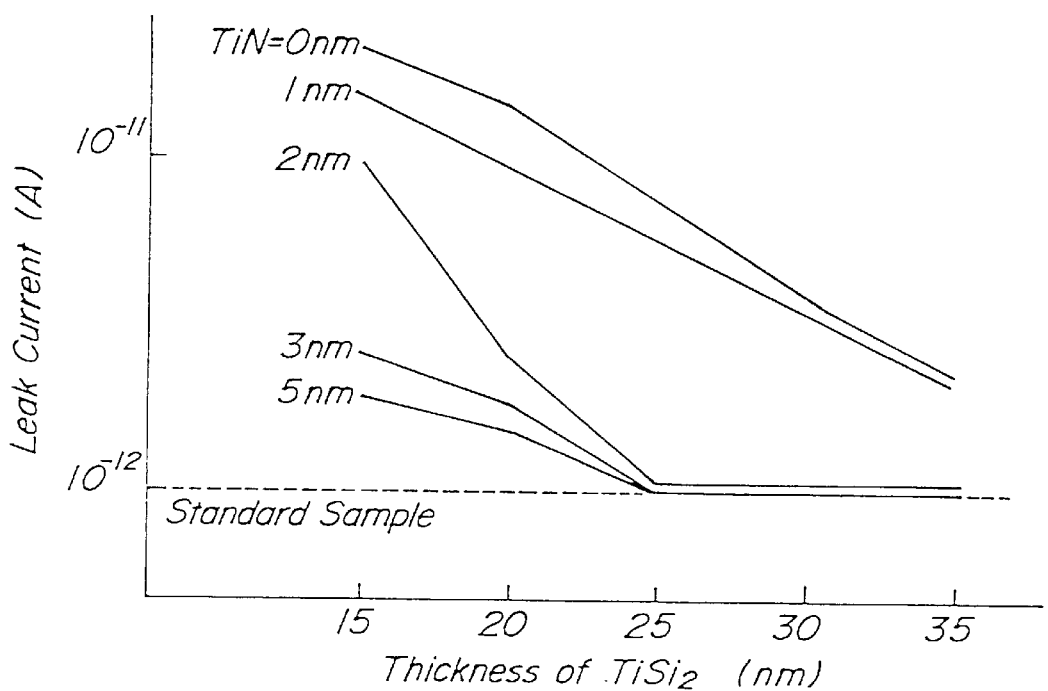
FIG_10
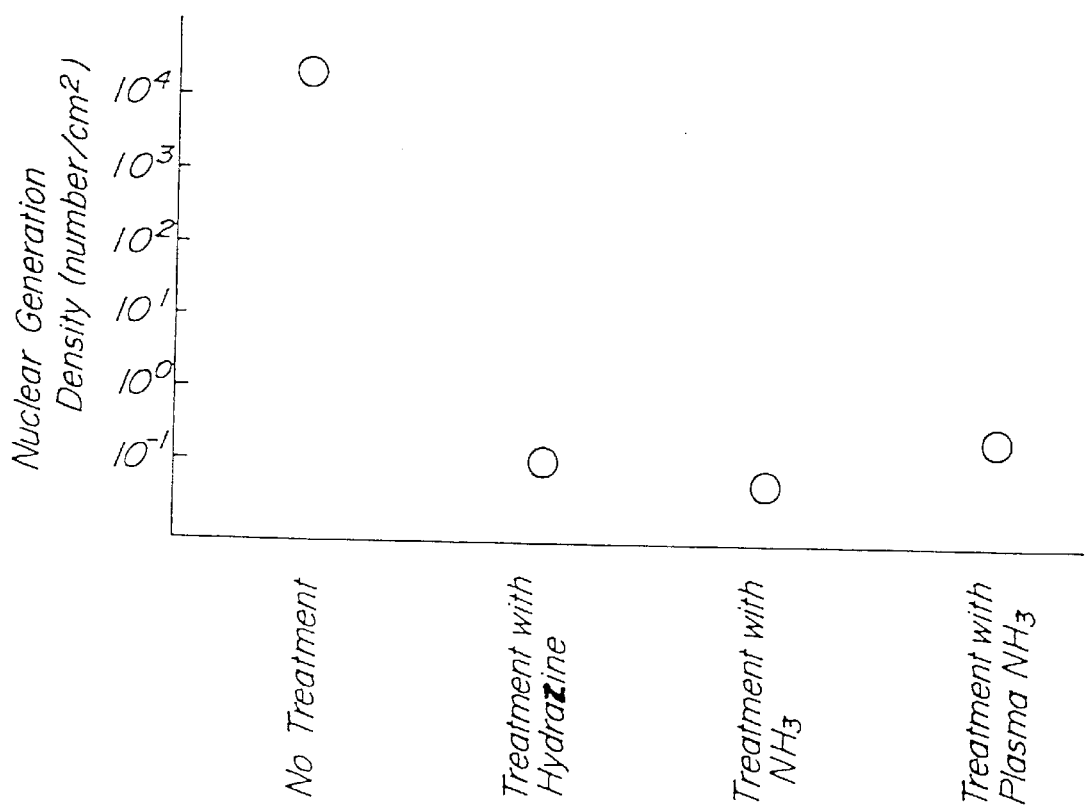
FIG_11

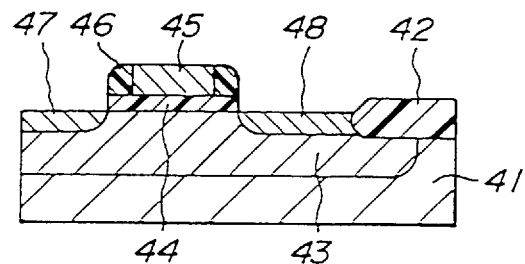
FIG_12A
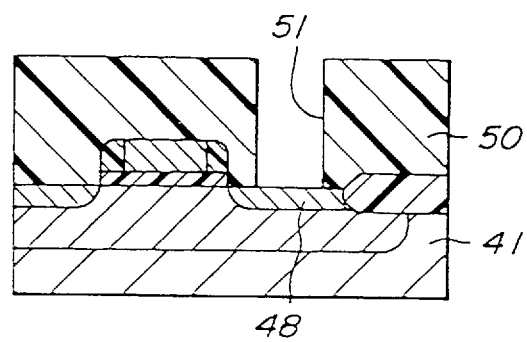
FIG_12B
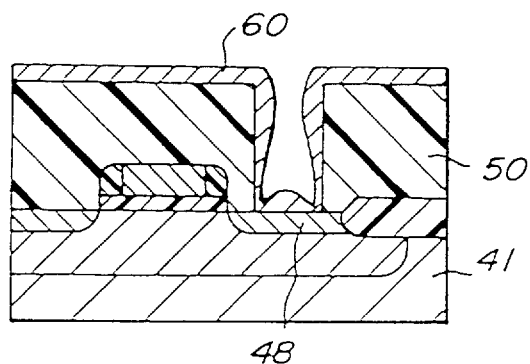
FIG_12C
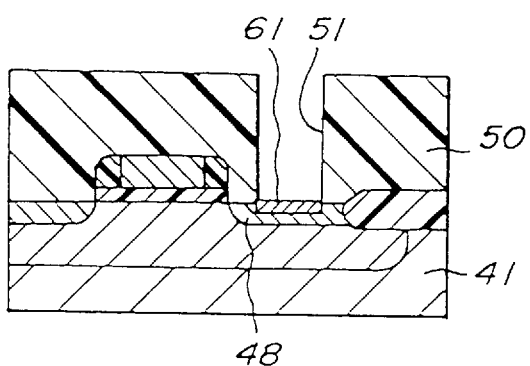
FIG_12D

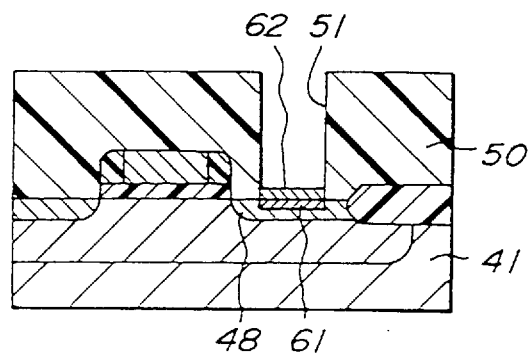
FIG_12E
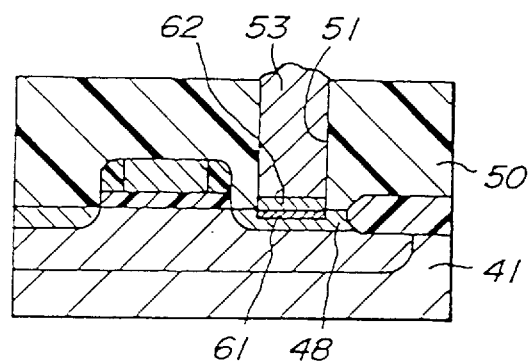
FIG_12F
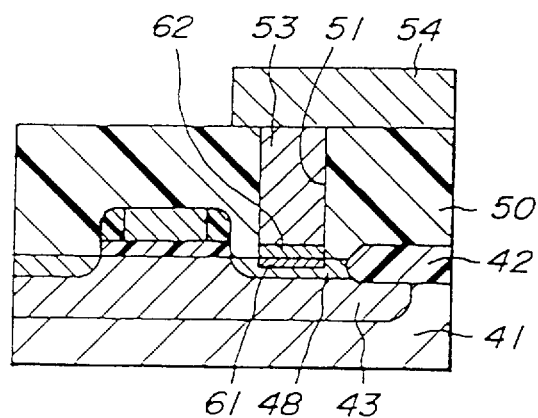
FIG_12G

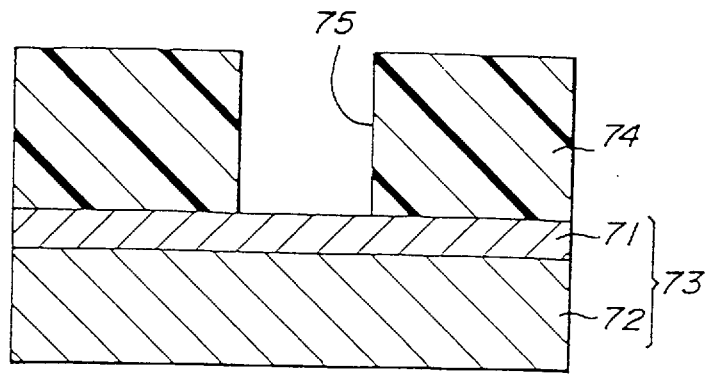
FIG_13A
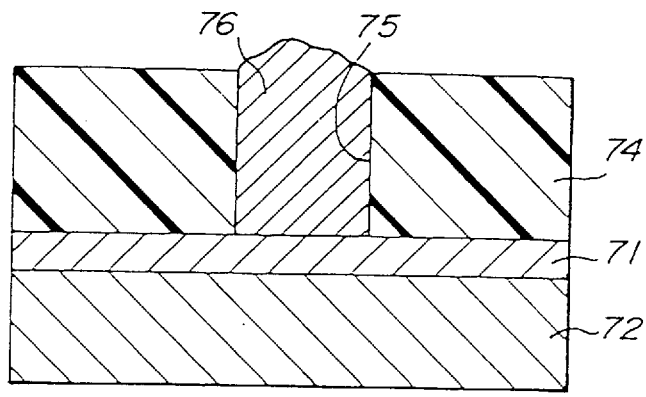
FIG_13B
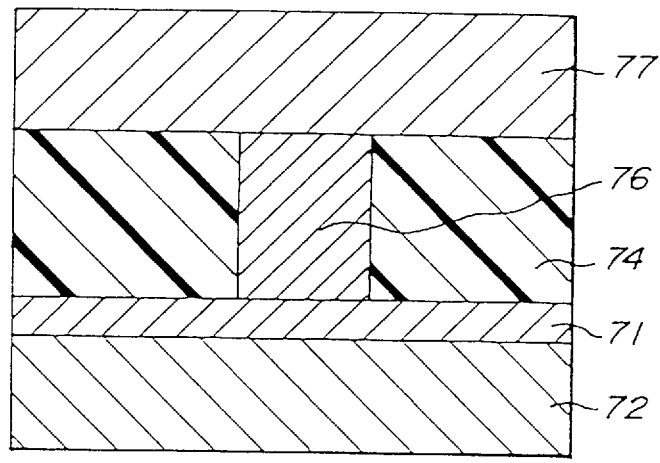
FIG_13C

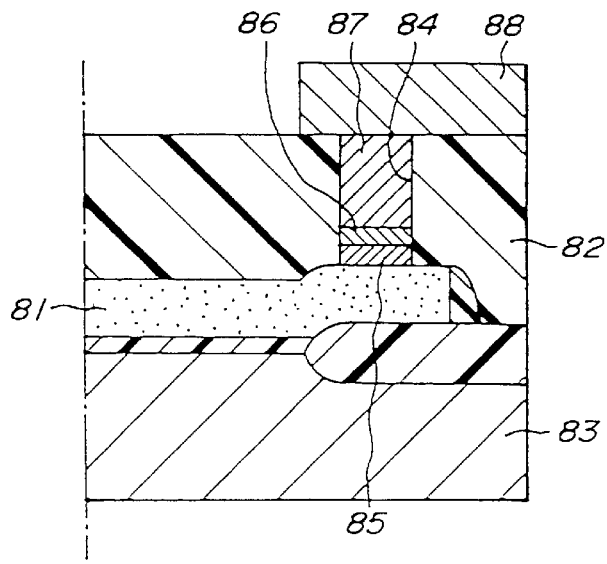
FIG_14
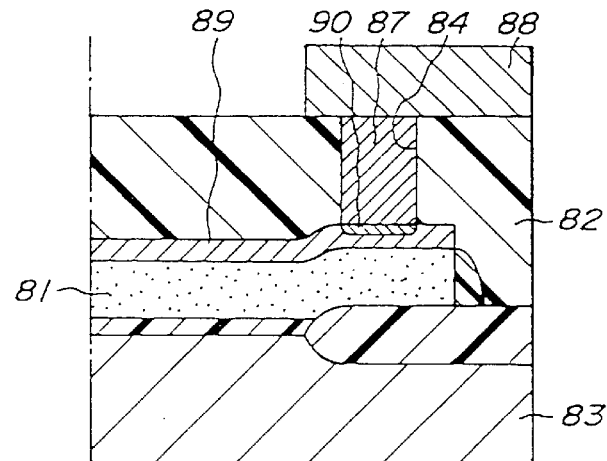
FIG_15
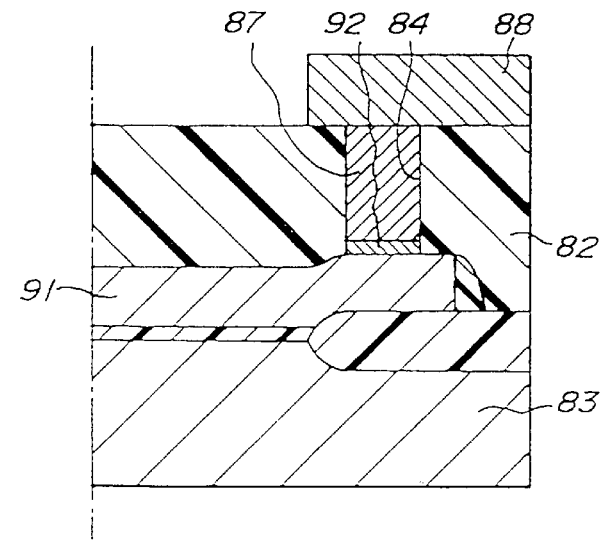
FIG_16

FIG_17A
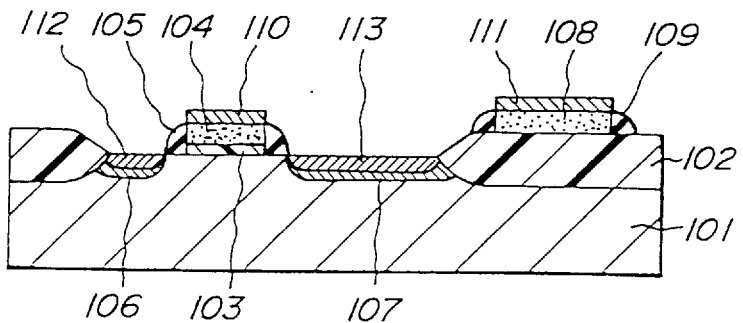
FIG_17B
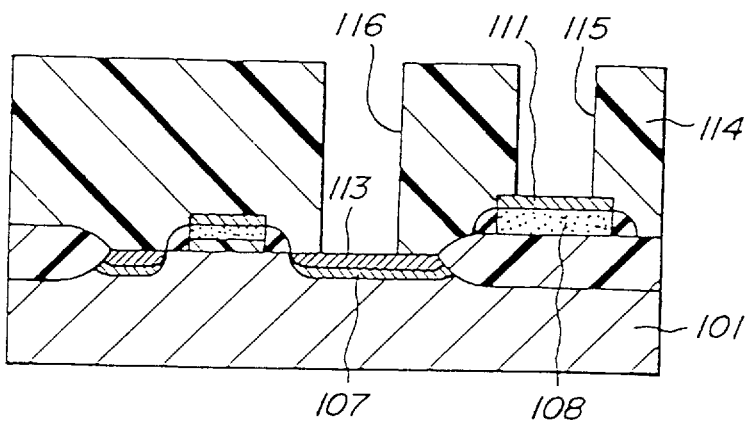
FIG_17C
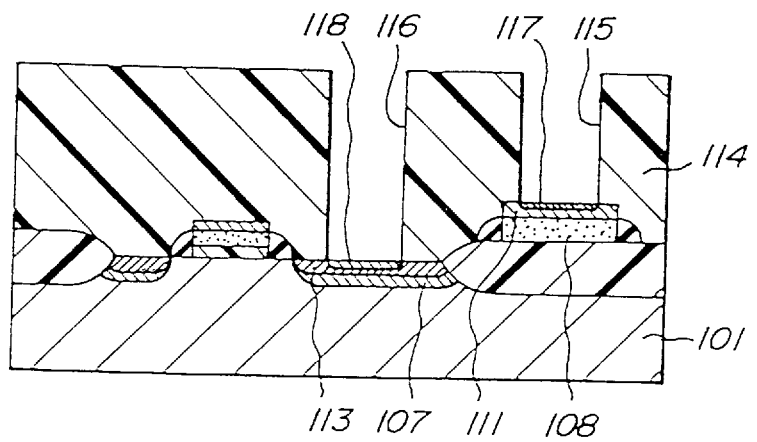

FIG_17D
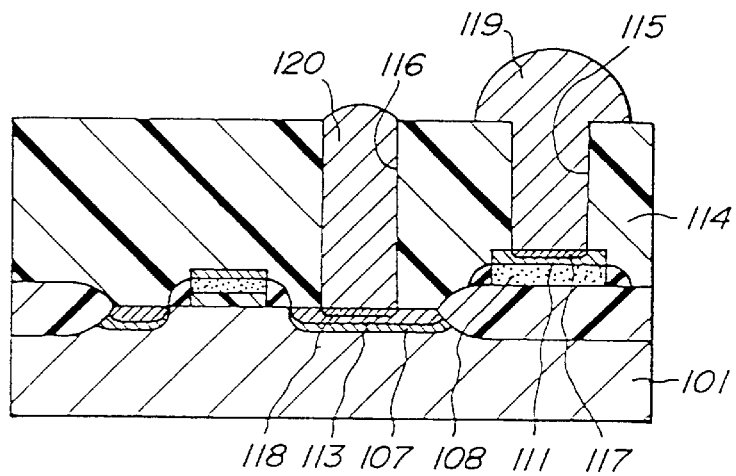
FIG_17E
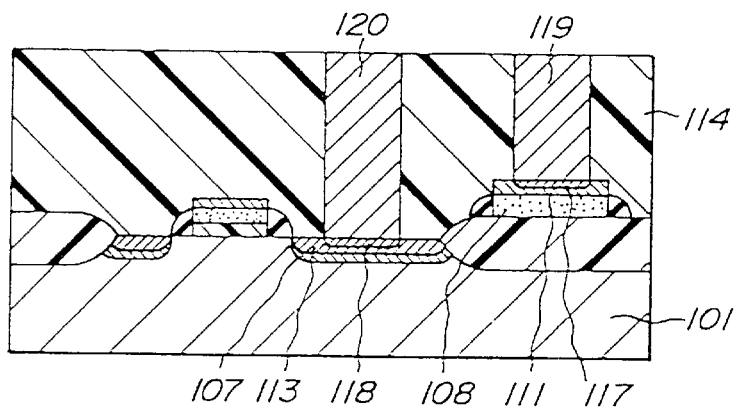
FIG_17F
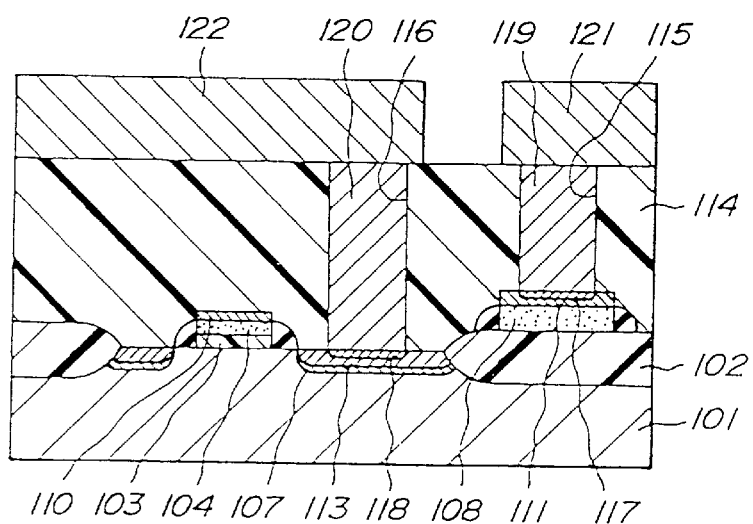

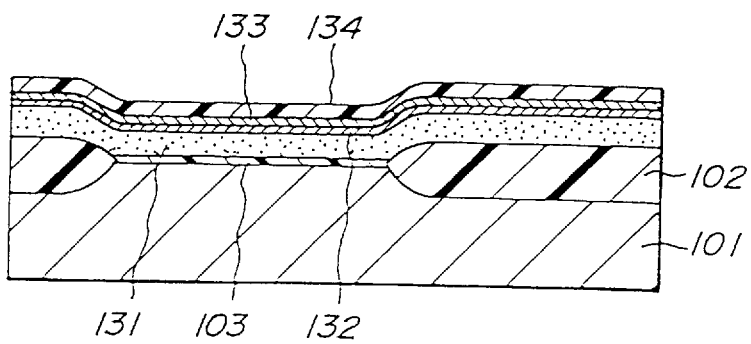
FIG_18A
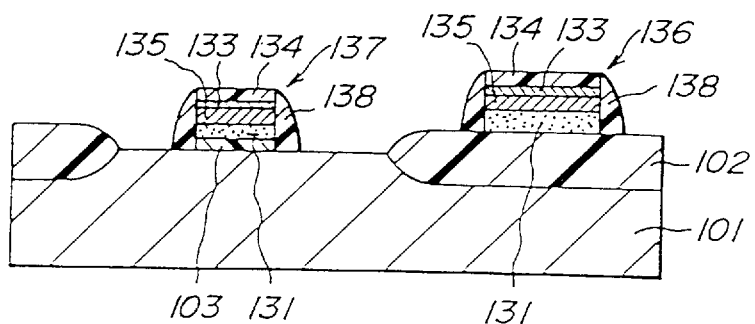
FIG_18B
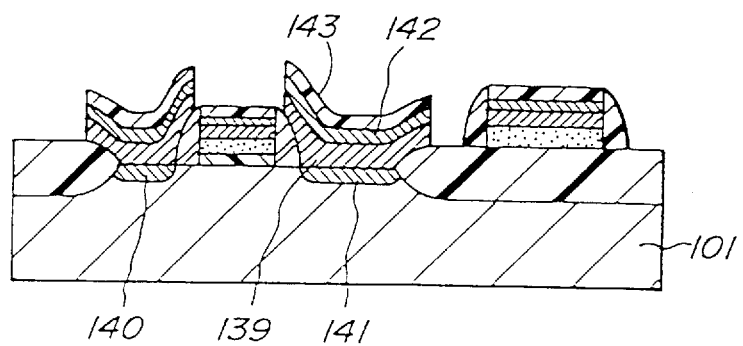
FIG_18C

FIG_18D
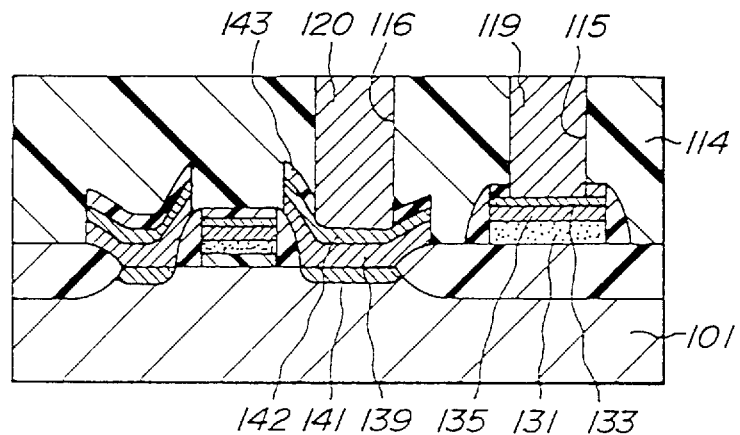
FIG_18E
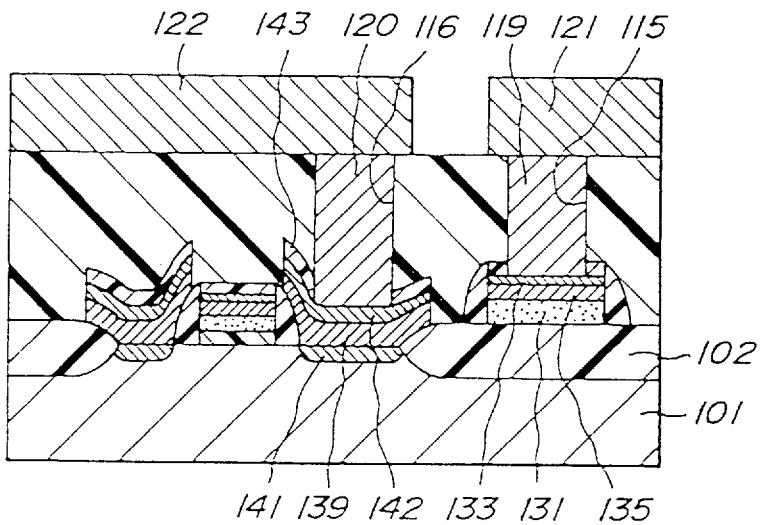

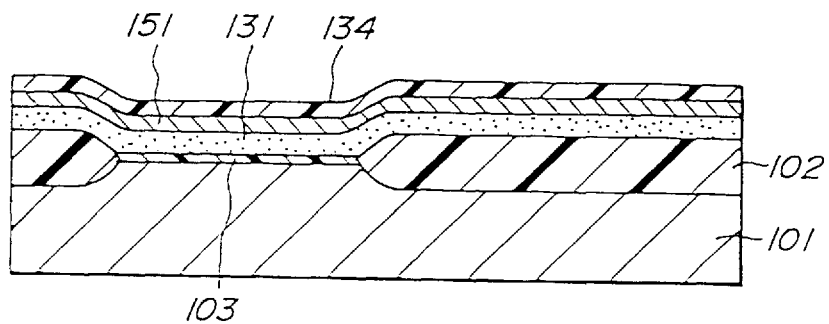
FIG_19A
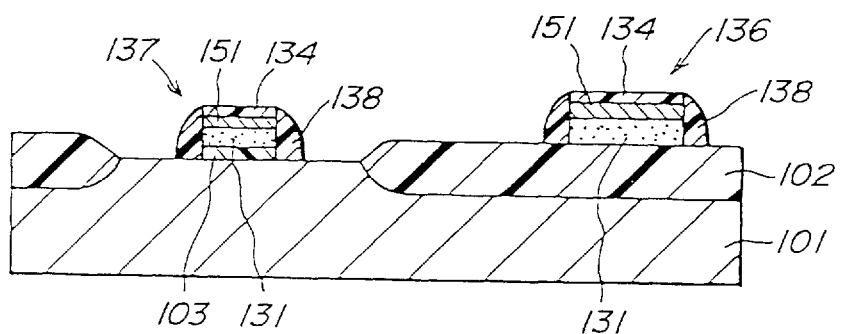
FIG_19B
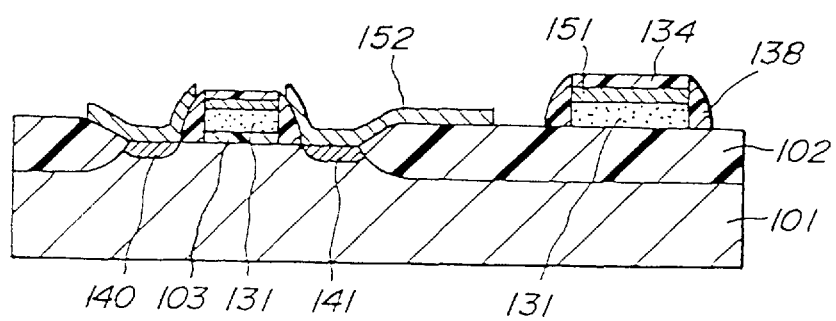
FIG_19C

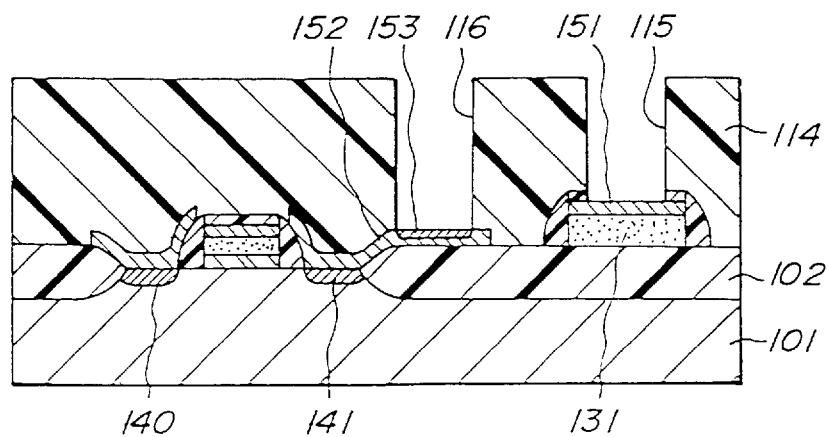
FIG_19D
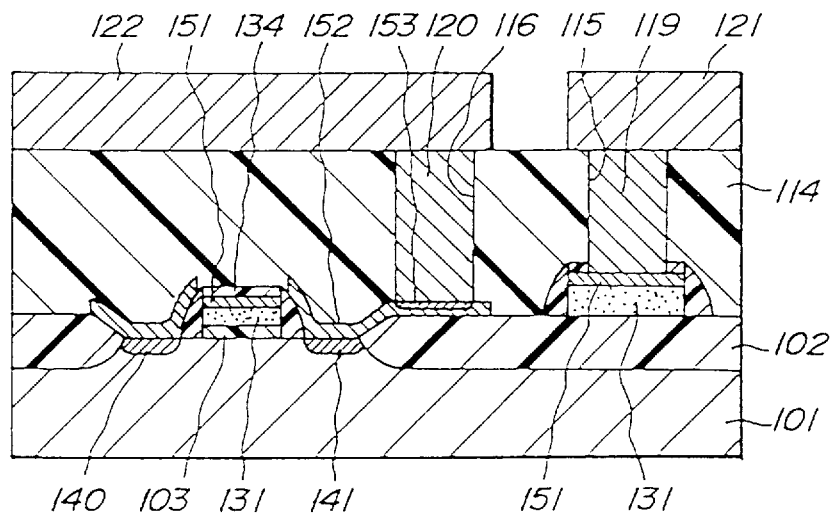
FIG_19E

This invention relates to a semiconductor device with a contact structure for connecting a conductive region formed on at least one of a junction formed in and a gate insulating film formed on a substrate, such as a diffusion region and a gate electrode of the semiconductor device, to a metal wiring. This invention also relates to a method of manufacturing a semiconductor device including such a contact structure.

SEMICONDUCTOR DEVICE WITH CONTACT STRUCTURE AND METHOD OF MANUFACTURING THE SAME

BACKGROUND OF THE INVENTION

1. Field of the Invention

This invention relates to a semiconductor device with a contact structure for connecting a conductive region formed on at least one of a junction formed in and a gate insulating film formed on a substrate, such as a diffusion region and a gate electrode of the semiconductor device, to a metal wiring. This invention also relates to a method of manufacturing a semiconductor device including such a contact structure.

2. Description of the Related Art

In a semiconductor device including MOSFET transistor, source and drain regions of these transistors are connected to metal wirings by means of contact structures. In a known semiconductor device, a contact structure is formed by the following steps. At first, an insulating film such as an interlayer insulating film, i.e., a $SiO_2$ film, is formed on a silicon substrate having a surface in which transistor regions are formed. Then, the insulating film is selectively removed to form a contact hole. Next, a Ti film, a TiN film and an Al film are successively deposited by sputtering on the surface of the insulating film as well as in the contact hole. After that, a multilayered metal film on the insulating film is selectively removed in accordance with a desired pattern to form metal wirings.

In this known contact structure, the Ti film reacts with silicon atoms of the diffusion region during a heating process after the deposition to form a silicide which serves to decrease a contact resistance between the diffusion region and the metal wiring. The TiN film serves to prevent the mutual movement of the silicon atoms and metal atoms of the metal wiring, so that a junction formed between the diffusion region and a bulk of the silicon substrate or a well formed in the surface of the silicon substrate can be protected against breakage. That is, the TiN film serves as an anti-diffusion film. The Al film constitutes a main body of the metal wiring and serves to conduct an electric-current at a low resistance.

However, in the usual sputtering method, it is rather difficult to deposit an aluminum alloy film within a fine contact hole. Therefore, when manufacturing a semiconductor device including contact holes having a diameter smaller than about 0.8 μm, a metal film is not deposited simultaneously on the insulating film as well as in the contact holes. Rather, metal plugs are first formed within the contact holes. Then, a metal wiring film is deposited on the insulating film as well as on the plugs.

Conventionally, the source and drain regions of MOS transistors are formed by diffusion regions having impurities such as A and B diffused therein. In recent MOS transistors, it has been required to make a gate length shorter than about 0.5 μm. In this situation, the resistance of the diffusion regions becomes comparable to a channel resistance. Therefore, particularly in high speed logic integrated circuits, a silicide of a high melting point metal, such as $TiSi_2$, is formed on a diffusion region in order to decrease the resistance of the source and drain regions.

FIGS. 1A to 1D are cross-sectional views showing successive steps for manufacturing a MOS transistor in which a silicide of high melting point metal is used.

As shown in FIG. 1A, wells 3 are formed on a surface of a silicon substrate or wafer 1 such that they are isolated by the field oxide film 2. A MOS FET is formed in a well 3. A gate of the MOS FET is formed by a gate insulating film 4, such as oxide and nitrided oxide films, a highly doped polysilicon layer 5 and a silicide film 6, such as $TiSi_2$. On both sides of the gate, a source region 7 and a drain region 8 are formed. Silicide films 9 and 10 are formed on the surfaces of the source region 7 and drain region 8. The silicide films 6, 9 and 10 may be formed by a known salicide method which is described in, for instance, C. Y. Ting et al, 2nd International IEEE VLSI Multilevel interconnection Conference, (1985) p. 307.

Next, as illustrated in FIG. 1B, an insulating layer 11 is formed on the silicon substrate 1. A contact hole 12 is formed in the insulating layer 11 by selectively removing a portion of the insulating layer 11. Then, a metal composite film 13 is deposited on the insulating layer 11 as well as on an inner surface of the contact hole 12 by depositing thin Ti film and TiN films successively in this order. Then, a tungsten (W) film 14 is deposited on the whole surface of the substrate by chemical vapor deposition (CVD) using a hexafluoro tungsten ($WF_6$) gas as a raw material gas as shown in FIG. 1C. During this CVD process, the metal film 13 serves as an adhering film. Then, the tungsten film 14 is etched back to form the plug 15 embedded in the contact hole 12, as shown in FIG. 1D. Finally, a metal film is formed on the insulating film 11 such that it is connected to the tungsten plug 15. The metal film is then patterned into a desired metal wiring.

In the known method of manufacturing the contact structure including the plug, after the Ti/TiN film 13 is formed on the insulating film 11, the tungsten film 14 is deposited on the insulating film while the Ti/TiN film is used as the adhering film. Then, the tungsten film 14 is etched back to form the plug 15 within the contact hole 12. It is apparent that this known method is rather complicated.

Further, if the contact hole 12 is formed with a reversed taper shape, during the formation of the tungsten film 14, a seam or void is liable to be formed within the contact hole 12. Then, it is no longer possible to obtain good electrical contact and the reliability of the MOSFET is decreased. Moreover, when the tungsten film is formed from the $WF_6$ gas, it contains a large amount of fluorine. It should be noted that fluorine is very corrosive, so that the metal wiring is damaged and the transistor characteristics are degraded.

It has further been proposed to form a plug within the contact hole by means of selective CVD, as shown in FIG. 2. In this selective CVD, a $WF_6$ gas flows along the surface of the substrate and a tungsten film is selectively deposited in the contact hole 12 where the titanium silicide film 10 is exposed at the bottom of the contact hole. In this method, the contact hole 12 can be completely filled with tungsten and no seam or void is formed in the tungsten film.

However, even in this method, a large amount of fluorine is incorporated into the tungsten plug 15. Moreover, the fluoro series gas flowing along the surface of the substrate is reacts with the titanium silicide film 10 to form particles of $TiF_3$ 16 on the surface of the titanium silicide film 10. These $TiF_3$ particles 16 at a boundary between the plug 15 and the silicide film 10 increase the contact resistance.

In order to mitigate the above mentioned drawback, it has been also proposed to perform selective CVD of tungsten after converting the surface of the titanium silicide film 10, which is exposed at the contact hole 12, into a TiN film by using a nitriding treatment. This method has been described in "VLSI Technology Symposium", Martin S. Wang et al, 1991, p. 41. However, this method does not solve the problem of the corrosion and degradation of property due to fluorine.

In Japanese Patent Application Laid-open Publication 3-110838, another method of forming a contact plug is proposed, by selective CVD using a raw material gas containing aluminum. A similar method has been also described by Kouichi Tani and Satoshi Nishikawa (OKI), in Extended Abstracts 1993, International Conference of SSDM, p. 543 (1993). In these publications, an aluminum plug is formed directly on the surface of the silicon substrate. However, as shown by Tani and Nishikawa, the surface of the silicon substrate is eroded by the aluminum during CVD and the junction characteristics are degraded. Until now, no publication about the formation of aluminum plug by selective CVD on a silicide film formed by the salicide method is available.

In selective CVD of aluminum, the aluminum has to be deposited only in the contact hole and not on the insulating film. However, in practice, the aluminum is liable to be deposited on the insulating film as well as on the side walls of the contact hole, due to the dangling bonds existing on the surface of the insulating film. Therefore, a void might be formed within the aluminum plug. Moreover, the aluminum deposited on the insulating film might short-circuit the metal wirings.

It has been further proposed to form the $TiSi_2$ film by means of CVD using $TiCl_4$ gas and $SiH_4$ gas. However, this CVD process is difficult to control. In addition, silicon atoms might be sucked from the diffusion layer into the $TiSi_x$ film so that the contact property is deteriorated. At the same time, an excess amount of silicon atoms supplied from the $SiH_4$ gas remain within the $TiSi_x$ film, so that the contact resistance increases. Particularly, when a thick film is to be deposited, it is very difficult to avoid these drawbacks, so that the contact hole cannot actually be filled only with the $TiSi_2$ film.

It has been further proposed to heat the substrate at a temperature above 450° C. during the deposition of the aluminum alloy film by sputtering, such that aluminum alloy flows into the contact hole. This method is disclosed in "T. Hariu et al, 1989 International Reliability Physics Symposium", p. 200, and Chen et al, 1990 International Electron Device Meeting, p. 51. However, this known method also requires the Ti/TiN metal film in order to make the aluminum alloy film flow into the contact hole, as in the method in which the plug is formed by depositing the tungsten film all over the substrate surface. The Ti/TiN metal film is also required to decrease the contact resistance and to avoid the degradation of the junction due to the temperatures during the deposition of the aluminum alloy film.

Moreover, this method can be effectively applied only to contact holes having a diameter larger than about 0.8 $\mu$m. If the contact hole has a smaller diameter than 0.8 $\mu$m, it requires further complicated processes, such as the deposition of a Ti film on the TiN film prior to the deposition of the aluminum alloy metal to increase the ability of the aluminum alloy film to flow into the contact hole. In this manner, this known method requires a rather complicated process and cannot be actually used in production scales.

SUMMARY OF THE INVENTION

Accordingly, this invention provides a novel and useful semiconductor device including a contact structure which can remove or mitigate the above mentioned drawbacks of the known contact structures.

This invention also provides a novel and useful method of manufacturing a semiconductor device including a contact structure, which can be easily manufactured by merely flowing a raw material gas over a surface of a substrate during a selective Al CVD process.

In a first preferred embodiment of the contact structure of this invention, a semiconductor device with a contact structure comprises: a semiconductor substrate having a surface; at least one of a junction formed on and a gate insulating film formed over the surface of the semiconductor substrate; a conductive region formed on at least one of the junction and the gate insulating film; an insulating film formed on the at least one conductive region; a contact hole formed in the insulating film, wherein an area of the contact hole is not larger than 0.7 $\mu m^2$; a plug formed in the contact hole and containing aluminum; a silicide film of a high melting point metal formed at least at a bottom portion of the plug; and metal wiring formed on the insulating film such that the metal wiring is electrically connected to the at least one conductive region by the plug and the silicide film, wherein the metal wiring contains aluminum.

In a second preferred embodiment of the contact structure of this invention, the semiconductor device with the contact structure comprises: a semiconductor substrate having a surface; at least one of a junction formed on and a gate insulating film formed over the surface of the semiconductor substrate; a conductive region formed on at least one of the junction and the gate insulating film; an insulating film formed on the at least one conductive region; a contact hole formed in the insulating film; a plug formed in the contact hole and containing aluminum; a silicide film of a high melting point metal formed at least at a bottom of the contact hole; an anti-diffusion film formed at least on the silicide film at the bottom of the contact hole; and metal wiring formed on the insulating film such that the metal wiring is electrically connected to said conductive region by the plug, the anti-diffusion film and the silicide film, wherein the metal wiring contains aluminum.

The conductive region may be formed by a diffusion region formed on the surface of the semiconductor substrate or a gate electrode of a MOSFET. In this case, the gate electrode may be formed by highly doped polysilicon film, a stack of a highly doped polysilicon film and a metal silicide film such as $WSi_x$ and $TiSi_x$, a metal silicide, or metal, such as tungsten.

In yet another preferred embodiment of the contact structure of this invention, in place of the anti-diffusion film formed at least under the bottom portion of the plug, as in the second preferred embodiment of the contact structure, the grain boundaries of the grains of the silicide film are nitrided to form a nitride of the high melting point metal within only the grain boundaries of the silicide film. The aluminum plug is then formed on the grain-boundary-nitrided silicide film. However, since the grain boundaries of the silicide film contain the nitride of the high melting point metal, the aluminum cannot diffuse through the silicide film into the conductive region.

A first preferred embodiment of a method of manufacturing the semiconductor device with a contact structure according to this invention comprises the steps of: preparing a semiconductor substrate which has a surface; forming a conductive region on at least one of a junction formed on and a gate insulating film formed over the surface of the semiconductor substrate; forming an insulating film on the conductive region; forming a contact hole having an area at most 0.7 $\mu m^2$ in the insulating film; forming a silicide film of a high melting point metal at least at a bottom of said contact hole prior to forming the insulating film and/or after forming the contact hole; forming a plug containing aluminum in the contact hole by depositing an aluminum-containing metal by chemical vapor deposition using an organic aluminum compound gas; and forming metal wiring containing aluminum on the insulating film such that the metal wiring is electrically connected to the conductive region by the plug and the silicide film.

In a second preferred embodiment of the method of this invention, the method of manufacturing the semiconductor device with the contact structure comprises the steps of: preparing a semiconductor substrate which has a surface; forming a conductive region on at least one of a junction formed on and a gate insulating film formed over the surface of the semiconductor substrate; forming an insulating film on the conductive region; forming a contact hole in the insulating film; forming a silicide film of a high melting point metal at least at a bottom of the contact hole prior to forming the insulating film and/or after forming the contact hole; forming an anti-diffusion film at least on the silicide film at the bottom of the contact hole prior to forming the insulating film or after forming the contact hole; forming a plug containing aluminum in the contact hole by depositing an aluminum-containing metal by chemical vapor deposition using an organic aluminum compound gas; and forming metal wiring containing aluminum on the insulating film such that the metal wiring is electrically connected to the conductive region by the plug, the anti-diffusion film and the silicide film.

According to this invention, the anti-diffusion film may be formed prior to or after the formation of the contact hole. In another preferred embodiment of the method according to this invention, the anti-diffusion film is simply formed by nitriding the silicide film via the contact hole.

Additionally, instead of merely converting the surface of the silicide film to a nitride film, as in the second preferred embodiment, in another preferred embodiment, the anti-diffusion film is replaced with a nitride of the high melting point metal formed in the grain boundaries of the grains of the silicide film. That is, in this preferred embodiment, rather than forming a stoichiometric nitride film of the high melting point on the silicide film, only the grain boundaries of the grains of the silicide film are nitrided. The aluminum plug is then formed on the grain-boundary-nitrided silicide film. However, since the grain boundaries of the silicide film contain the nitride of the high melting point metal, the aluminum cannot diffuse through the silicide film into the conductive region.

When actually manufacturing the semiconductor devices, a plurality of contact holes are formed in a single insulating film. In some cases, these contact holes have different depths. Accordingly, in this invention, even this case, it is possible to form complete plugs having excellent electrical contact with the conductive region. That is, according to this invention, after forming a plurality of contact holes having different depths in the insulating film, the selective Al CVD process for forming the aluminum-containing plugs is carried out for a sufficient time period that the deepest contact hole is completely filled with a plug.

Thus, for the shallower contact holes, the plugs protrude from the surface of the insulating film. According to this invention, those portions of the plugs which protrude from the surface of the insulating film are removed by chemical mechanical polishing (CMP) to obtain a flat surface.

According to yet another preferred embodiment of the method of this invention, the method of manufacturing the semiconductor device with the contact structure comprises the steps of: preparing a semiconductor substrate which has a surface; forming a conductive region on the surface of the semiconductor substrate; forming an insulating film on the conductive region; forming a contact hole in the insulating film; performing a nitriding treatment to terminate dangling bonds on the surface of the insulating film by heating the surface of the semiconductor substrate in a nitriding atmosphere; and forming a plug containing aluminum in the contact hole by depositing an aluminum-containing metal by selective chemical vapor deposition using an organic aluminum compound gas.

These and other features and advantages of the invention are described in or apparent from the following detailed description of the preferred embodiments.

BRIEF DESCRIPTION OF THE DRAWINGS

The preferred embodiments of this invention will be described in detail, with reference to the following figures, wherein:

FIGS. 1A to 1D are cross-sectional views showing successive steps of a known method of manufacturing the semiconductor device with a contact structure;

FIG. 2 is a cross-sectional view illustrating a known contact structure;

FIGS. 3A and 3B are cross-sectional and plan views depicting a contact structure used in an experiment for providing the function of the invention;

FIGS. 4A to 4D are cross-sectional views illustrating successive steps of a first embodiment of the method according to the invention;

FIG. 5 is a graph representing the relationship between the diameter of the contact hole and the percent defect;

FIGS. 6A and 6B are cross-sectional views showing different shapes of the contact hole;

FIGS. 7A to 7D are cross-sectional views depicting successive steps of a second embodiment of the method according to the invention;

FIGS. 8A to 8D are cross-sectional views illustrating successive steps of a third embodiment of the method according to the invention;

FIGS. 9A to 9G are cross-sectional views showing successive steps of a fourth embodiment of the method according to the invention;

FIG. 10 is a graph representing a relationship between a thickness of the $TiSi_2$ film and the leak current;

FIG. 11 is a diagram depicting an improvement of the nuclear generation density;

FIGS. 12A to 12G are cross-sectional views showing successive steps of a fifth embodiment of the method according to the invention;

FIGS. 13A to 13C are cross-sectional views illustrating steps of a sixth embodiment of the method according to the invention;

FIGS. 14, 15 and 16 are cross-sectional views depicting three embodiments of the contact structure according to the invention;

FIGS. 17A to 17F are cross-sectional views illustrating successive steps of a seventh embodiment of the method according to the invention;

FIGS. 18A to 18E are cross-sectional views depicting successive steps of an eighth embodiment of the method according to the invention;

FIGS. 19A to 19E are cross-sectional views showing successive steps of a ninth embodiment of the method according to the invention;

DETAILED DESCRIPTION OF THE PREFERRED EMBODIMENT

Figure 20:
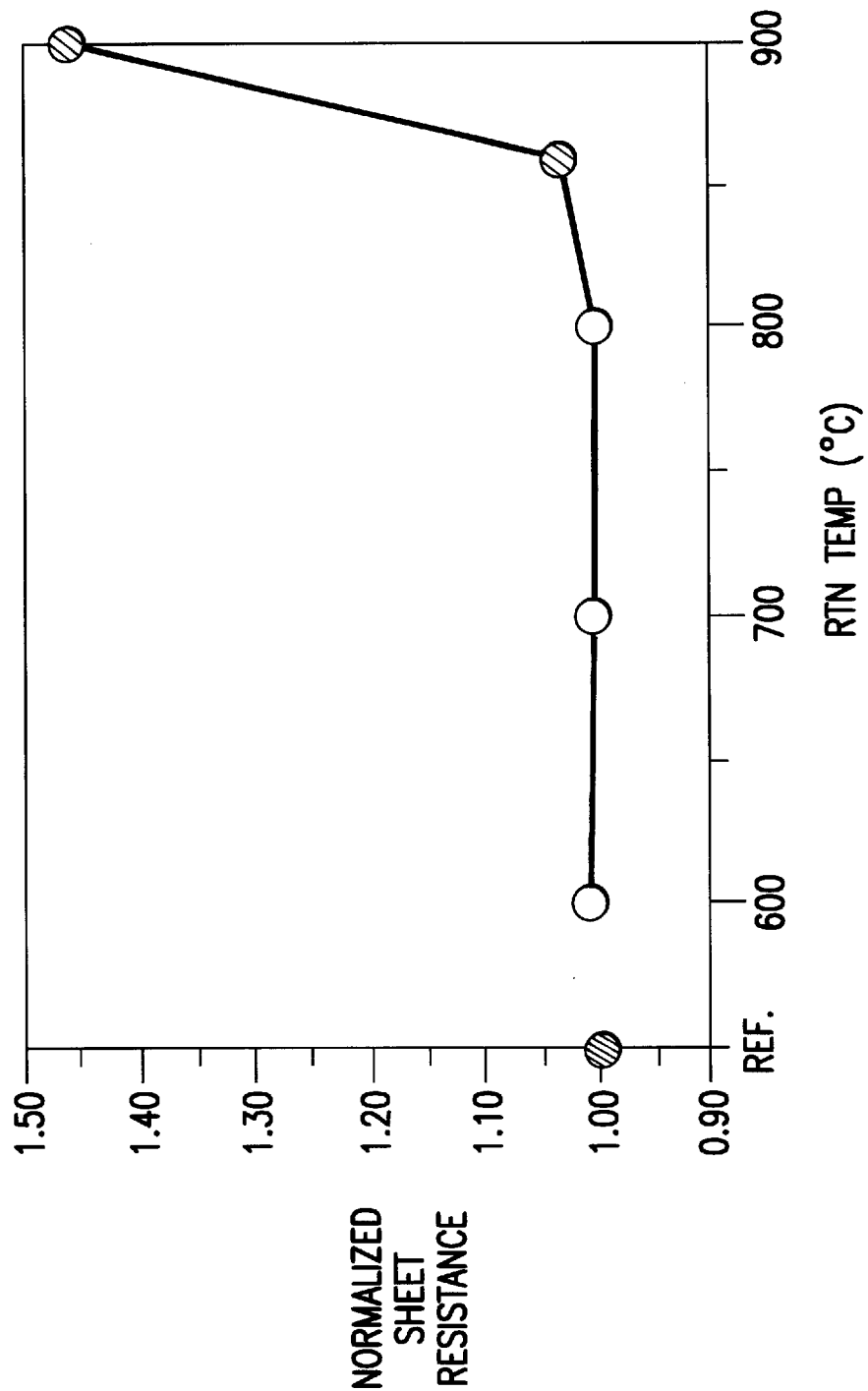
FIG. 20 is a graph showing the change in sheet resistance as a function of the rapid thermal nitridation process temperature.

FIGS. 4A to 4D are cross-sectional views showing successive steps of a first embodiment of the method of manufacturing the semiconductor device having a contact structure for connecting a drain region of a MOSFET to a metal wiring. The semiconductor device comprises a P type silicon substrate 21 having a surface in which a field oxide film 22 is formed for isolating a transistor formed in a P type well 23 from the adjacent wells. The field effect transistor comprises a gate oxide film 24 on which a gate electrode 25 made of polysilicon is formed.

After forming a side wall 26, arsenic (As) is diffused into the P type well 23 to form the N+ source and drain regions 27 and 28. In this process, As is also diffused into the polysilicon gate electrode 25. A depth of the junctions between the source and drain regions 27 and 28 and the P well 23 is about 0.12 μm. Next, silicide films ($TiSi_2$) 29a–29c are formed on the entire uppper surfaces of the polysilicon gate 25 and the source and drain regions 27 and 28 by a known Ti salicide process. These silicide films 29a–29c have a thickness of about 70 nm.

Then, an interlayer insulating film 30 made of silicon dioxide ($SiO_2$) is formed on the surface of the silicon substrate 21. This interlayer insulating film 30 has a thickness of about 1 μm. Then, a photoresist (not shown) is formed on the insulating film 30 and is patterned by photolithography technique. Next, the insulating film 30 is selectively removed to form a contact hole 31 having a diameter of 0.5 μm by reactive ion etching (RIE). The photoresist is used as a mask, as illustrated in FIG. 4B. At a bottom of the contact hole 31, the silicide film of high melting point metal 29c is exposed.

After removing the photoresist, a dimethylaluminumhydride (DMAH) gas is flowed over the surface of the silicon substrate. An aluminum plug 32 is selectively deposited in the contact hole 31, as shown in FIG. 4C. It was found that the plug 23 is formed by a single aluminum grain.

According to this invention, instead of DMAH, it is also possible to use other organic aluminum compounds such as trimethylamine alane, dimethylethylamine alane, triethylamine alane, triisobutylaluminum, trimethylaluminum and an intermolecular compound of DMAH and trimethylaluminum.

Moreover, by supplying a gas containing copper, such as cyclopentadienyl-triethylphosphine copper in addition to DMAH, it is possible to deposit an aluminum-copper alloy. Further, it is also possible to selectively deposit aluminum alloy, such as Al—Ti, Al—Si and Al—Sc by supplying a gas containing impurity elements which improve a quality of the aluminum film.

Next, a Al—Cu alloy film having a thickness of 0.8 μm is formed on the substrate 21 having the plug 32. Then, the Al—Cu film is patterned by RIE into a metal wiring 33. Thus, the Al—Cu alloy metal wiring 33 is electrically connected to the drain region 28 by the aluminum plug 32 and the silicide film 29C, as shown in FIG. 4D. In order to stabilize the transistor's properties, the substrate 21 is heated at 450° C. for thirty minutes under a mixture of nitrogen and hydrogen. Then, the characteristics of the contact structure were measured.

In this first preferred embodiment of the method for manufacturing the semiconductor device, the plug 32 is formed only in the contact hole 31 by the selective CVD process in which the DMAH gas is flowed over the substrate surface. Therefore, it is no longer necessary to deposit the metal adhering Ti/TiN film over the whole surface of the substrate, form a tungsten film over the whole surface of Ti/TiN film, and etch back the tungsten film. According to this invention, such a complicated process is not required and the plug can be formed very simply.

Further, in this preferred embodiment, it is possible to form the plug 32 within the contact hole 31 regardless of the shape of the contact hole. That is, even when the contact hole 31 has a reversely tapered shape, as shown in FIG. 6A, or a diameter of the contact hole is very small, as illustrated in FIG. 6B, aluminum can be effectively deposited within the contact hole.

The inventors have conducted the following experiments by using two types of samples in order to confirm the effectiveness of this invention. In the first type of sample, a diameter of the contact holes was changed from 0.4 μm to 1.6 μm while the areas and the shapes of the diffusion layers and silicide films of high melting point metal remained constant. It should be noted that a total area of the contact surfaces was kept constant by adjusting the number of contact holes. In the second type of sample, an anti-diffusion film made of TiN and having a thickness of 100 nm was optionally formed under the Al—Cu alloy film (i.e., in some samples no such anti-diffusion film was formed between the plug and the silicide film).

It should be noted that a ratio of the total contact surface area to an area of the metal wiring was held constant, such as at 1/50. Furthermore, the mask pattern of the contact hole was designed to be rectangular. The contact holes having a size smaller than 0.8 μm had a substantially circular shape having a diameter not larger than 0.8 μm, while the contact holes larger than 1.2 μm were substantially rectangular.

FIG. 5 shows a graph representing the relationship between a percentage of contact deterioration and the size of the contact holes. The vertical axis represents the percentage of 412 samples of the contact structure of this invention whose contact was damaged or deteriorated. The inventors also manufactured standard samples having tungsten plugs formed by depositing the tungsten film over all of the substrate surface and having the contact size of 0.8 μm.

The contact damage was found when a leak current became thirty times larger than an average leak current of the standard samples. It should be noted that upon calculating the average leak current, those samples which showed leak currents thirty times larger than the average value were first removed. The defective percentage of the standard samples was about 3% and was mainly due to the diffusion layer forming process and salicide forming process.

Curve A in FIG. 5 represents the defective percentage of the samples in which the anti-diffusion film was not formed. Curve B illustrates the defective percentage of the samples in which the anti-diffusion film was formed. As shown by curve A, even if the anti-diffusion film is not formed, the defective percentage is very small when the diameter of the contact hole is smaller than 0.8 $\mu$m. However, the defective percentage increases abruptly when the diameter of contact hole becomes larger than 0.8 $\mu$m. This occurs because, when the contact hole has a diameter not larger than 0.8 $\mu$m, the plug is formed by a single aluminum grain, as shown in FIG. 4C, so that silicon and aluminum atoms move only at a very low speed.

On the other hand, when a diameter of contact hole exceeds 0.8 $\mu$m, the plug is formed by a plurality of aluminum grains, as shown in FIG. 3A, so that within the plug grain boundaries are formed along which the silicon atoms can easily move. Therefore, after forming the plug 32, when the substrate is heated to a temperature above 350° C. in order to improve the transistor characteristics and to form an insulating film by CVD on the metal wiring, silicon atoms diffuse from the diffusion layer 28 into the plug 32 via the silicide film 29c.

This occurs because the silicon atoms can freely move within the silicide film and can move along the boundary of the aluminum grains of the plug 32. In this manner, the silicon atoms move from the diffusion layer 28 into the plug 32, as shown by the solid arrows in FIG. 3A. As the result, vacant sites are formed within the diffusion layer 28 and aluminum atoms move from the plug 32 into the vacant sites, as shown by the broken arrows in FIG. 3A.

Particularly, when a metal wiring 33 made of aluminum or aluminum alloy is formed on the insulating film 11, a great amount of silicon atoms diffuse from the diffusion layer 28 along grain boundaries of the aluminum grains forming the metal wiring 33, as shown in the plan view of FIG. 3B. Therefore, within the P well 28, large numbers of vacant sites are formed which penetrate in the bulk of the substrate beyond the diffusion layer and a large amount of aluminum atoms intrude into the vacant sites. In this manner, a large spike 19 is formed within the P well 28 and junction leakage might occur.

In this manner, the contact property deteriorates. It should be noted that in some samples having the contact holes smaller than 0.8 $\mu$m, the defective percentage is slightly higher than that of the standard samples. Upon analyzing such defective samples, the plugs of some samples were determined to be formed by a plurality of aluminum grains. This occurs because, during the selective Al—CVD, impurities remain on the surface of the TiSi$_2$ film. A plurality of aluminum grains were formed because the impurities served as nucleation sites for the formation of grains. Therefore, if the substrate can be more completely cleaned, the defective percentage should be reduced.

As illustrated by curve D, when the anti-diffusion film was formed under the Al—Cu alloy film, the defective percentage is further reduced for the contact hole having a size not larger than 0.8 $\mu$m compared with the samples in which no anti-diffusion film is formed. Even when the size of the contact hole becomes larger than 0.8 $\mu$m, the increase in the defective percentage is smaller than that of curve A. That is, when the anti-diffusion film is formed between the plug and the Al—Cu metal wiring, the movement of the silicon and aluminum atoms is restricted to the diffusion region and plug. Thus, even if an aluminum grain boundary is formed in the plug, the large spike is not formed and the contact defect can be avoided.

The inventors further manufactured samples in which the plug is directly deposited on the diffusion region by the selective Al CVD. These samples had a percent defective higher than 90%. This occurs because, during the deposition of aluminum, aluminum atoms directly react with the diffusion region and very large spikes were formed.

From the above experiment, the inventors have found that the defective percentage can be remarkably reduced by limiting the diameter of contact hole to at most 0.8 $\mu$m. The defective percentage can be further reduced by forming an anti-diffusion film between the plug and the metal wiring.

By introducing silicon into the metal wiring at 0.7% by weight to form a metal wiring made of AlSiCu alloy, the defective percentage of the samples having no anti-diffusion film could be reduced to a level which is substantially equal to that of the samples having the anti-diffusion film. This value of 0.7% by weight exceeds the solid solution limit of silicon at 450° C., so that, although grain boundaries are formed in the plug, aluminum and silicon atoms are not able to move into or out of the AlSiCu metal wiring. Thus, large spikes are generally not formed and the contact defect does not occur.

When silicon is added over the solid solution limit, however, silicon grains might precipitate in the metal wiring and/or in the plug by the heating. In a semiconductor device having a fine structure, such silicon grains precipitated on the surface of the silicide film at the bottom of the contact hole might increase the contact resistance and deteriorate the reliability. Similarly, the defective percentage of the samples having the anti-diffusion films could be further decreased by introducing silicon into the plug. Note that, in this case, only the silicon contained in the plug can be precipitated on the surface of the silicide film. Therefore, the increase of the contact resistance is small.

In contrast, in samples having no anti-diffusion film and using the AlSiCu alloy metal wiring, all of the silicon contained in the metal wiring of some tens of microns long can precipitate onto the surface of the silicide film, since silicon can move in aluminum very rapidly. So, the increase in the contact resistance might be very large. In the above experiment, the square mask pattern was used for forming the contact holes. However, according to this invention, it is also possible to use a rectangular mask. In this case, the defective percentage remains small as long as an area of the contact hole is not larger than 0.7 $\mu m^2$, particularly $\pi \times (0.8/2)^2 = 0.5$ $\mu m^2$.

Furthermore, in the above experiment, a TiSi$_2$ film formed by the salicide method was used as the silicide film of high melting point metal. However, other materials may be equally used. For instance, after forming a Ti—Si$_x$ film by sputtering on the whole surface of the substrate, the unnecessary portion is removed by etching. Alternately, the TiSi$_x$ film may be formed only on the diffusion region and on the polysilicon gate electrode by a selective CVD using a mixture of TiCl$_4$ and SiH$_4$. Note that the atom ratio of silicon to metal in the silicide films formed by sputtering or CVD cannot be controlled exactly. Such silicides are indicated as $MSi_x$, where M is any metal. Other silicides of other high melting point metals, such as $WSi_x$, $MoSi_x$ and $TaSi_x$ may be formed CVD or sputtering.

However, use of $TiSi_2$ film formed by the salicide method is advantageous because the number of fabrication steps can be reduced. Further, $COSi_2$, NiSi and PtSi films may be formed by the salicide method similar to $TiSi_2$ film. Use of these silicides, including $TiSi_2$, is also advantageous for high speed logic integrated circuits because these silicides have smaller specific resistances compared with other silicides, such as $WSi_x$, $TaSi_x$ and $MoSi_x$. Note that, since silicon and aluminum atoms move rapidly in these silicide films, the contact structures of this invention are essential to forming semiconductor devices having good electrical characteristics.

As the anti-diffusion film, nitrides of a high melting point metal, such as TiN, WN, TaN, ZrN and HfN, oxide nitrides of a high melting point metal, such as TiON, and boride films of a high melting point metal, such as TiB, may be used. In the above embodiment, the contact structure is connected to the N+ diffusion region. However, according to this invention, it is also possible to form the contact structure connected to a P+ diffusion region.

FIGS. 7A to 7D are cross-sectional views showing successive steps in a second preferred embodiment of the method for manufacturing the contact structure according to this invention. In the second preferred embodiment, portions similar to those of the first preferred embodiment are denoted by the same reference numerals used in FIGS. 4A to 4D and their detailed explanation is dispensed with.

In the first preferred embodiment, the silicide film is formed directly on the diffusion region formed on the surface of the semiconductor substrate. According to the invention, it is also possible to insert a polysilicon film or an epitaxially grown silicon film between the diffusion region and the silicide film. In this case, the epitaxially grown silicon film and the polysilicon film should be highly doped to have the same conduction type as the diffusion region. In the first preferred embodiment, the contact structure is formed to connect the metal wiring to the drain diffusion region of the MOSFET. According to this invention, it is also possible to form contact structures for other devices. For example, the contact structure may be made to connect a metal wiring to an emitter diffusion region of a bipolar transistor.

Similar to the first preferred embodiment, in the second preferred embodiment, a MOSFET is formed on the silicon substrate 21. The insulating film 30 is formed on the substrate 21 and the contact hole 31 is formed by RIE in the insulating film such that the silicide film 29c is exposed in the bottom of the contact hole 31, as shown in FIGS. 7A and 7B. Then, the substrate is subjected to a rapid thermal nitrization (RTN) process by heating the substrate at 800° C. for one minute in an atmosphere of ammonia gas so that a surface of the silicide film 29c exposed at the bottom of the contact hole 31 is selectively changed into a nitride film 35 made of TiN, as shown in FIG. 7C.

Next, DMAH gas is flowed over the surface of the substrate to deposit aluminum selectively on the titanium nitride film 35 to form the plug 32, as shown in FIG. 7D. A metal wiring may be provided on the insulating film 30 such that it is connected to the plug 32.

In the second preferred embodiment, the diameter of the contact hole 31 is not limited to being at most 0.8 μm. Rather, a contact hole having any desired size may be used. That is, even if the plug 32 is formed by a plurality of aluminum grains including grain boundaries, the TiN film 35 formed between the silicide film 29c and the aluminum plug 32 serves as an anti-diffusion film so that the movement of silicon atoms within the silicon substrate 21 is inhibited by this film.

Therefore, the formation of the spike within the well 23 can be effectively prevented. It has been experimentally confirmed that the defective percentage of the contact structure of the second preferred embodiment was very small and was compatible with that of the standard samples, so that the reliability of MOSFET was further improved.

In the second preferred embodiment, the surface of the silicide film is nitrided to form an anti-diffusion film made of a nitride of a high melting point metal. According to this invention, it is also possible to form the anti-diffusion film from other materials. For example, the surface of the silicide film could be borided to form an anti-diffusion film made of a boride of a high melting point metal by boriding in an atmosphere of a boron-containing gas, such as $B_2H_6$.

FIGS. 8A to 8D are cross-sectional views illustrating successive steps of a third preferred embodiment of the method for manufacturing the contact structure according to this invention. In this third preferred embodiment, portions similar to those of the first and second embodiments are denoted by the same reference numerals used in the previous embodiments. In the third preferred embodiment, the source and drain regions 27 and 28 are formed in the silicon substrate 21, as shown in FIG. 8A. Then, the insulating film 30 is formed on the substrate 21, as illustrated in FIG. 8B, without forming the silicide film on the source and drain regions 27 and 28. Then, the contact hole 31 is formed in the insulating film 30 to expose the drain diffusion region 28 at a bottom of the contact hole 31.

Next, a mixture of $TiCl_4$ and $SiH_4$ is flowed over the substrate 21, which is heated to 750° C., to selectively deposit a silicide film 37 made of TiSi, onto the exposed surface of the drain diffusion region 28. The silicide film 37 has a thickness of about 100 nm. Then, the substrate 21 is subjected to the RTN process to change a surface of the silicide film 37 into a titanium nitride film 38, as shown in FIG. 8C. Next, a DMAH gas is flowed over the substrate surface and the aluminum plug 32 is formed in the contact hole by selective Al—CVD, as shown in FIG. 8D.

In the third preferred embodiment, it is possible to attain similar advantages to those of the second preferred embodiment. That is, the TiN film 38 between the drain region 28 and the aluminum plug 32 serves as an anti-diffusion film, so that the movement of silicon atoms from the drain region 28 into the plug 32 or the metal wiring 33 can be effectively prevented regardless of the size of the contact hole 31.

In the second preferred embodiment, the thickness of the nitride film 35 is restricted by a thickness of the silicide film of a high melting point metal 29c. When the transistor has been miniaturized, a thickness of the diffusion region also becomes thinner, so that a thickness of the silicide film also becomes thin. Therefore, the second preferred embodiment cannot be applied to highly miniaturized transistors. In the third preferred embodiment, the silicide film 37 of a high melting point metal can be formed regardless of the size of transistor. Thus, the third preferred embodiment can be effectively applied to highly miniaturized transistors.

In the third preferred embodiment, the silicide film 37 is formed only on the exposed surface of the drain diffusion region 28. According to this invention, it is also possible to form the silicide film over all of the surface of the diffusion regions 27 and 28 by the salicide method. Then, the insulating film is deposited and the contact hole is formed to expose a part of the silicide film. Then, TiSi$_x$ is selectively deposited on the exposed surface of the silicide film of high melting point metal. In this modification, the resistance of the source and drain regions can be reduced so that a high speed operation can be attained.

In a further modification of this alternative, the silicide film may be locally formed on the diffusion region, and then the TiSi$_x$ may be selectively deposited on the exposed surface of the silicide film after forming the insulating film and the contact hole. In these cases, the silicide film on the diffusion region may be formed by a silicide other than TiSi$_x$, such as CoSi$_x$. Also in these cases, the thickness of the TiSi$_x$ film deposited in the contact hole may be reduced so that all of the deposited TiSi$_x$ film is changed into the TiN film.

In the third preferred embodiment, after forming the anti-diffusion film by nitriding the TiSi$_x$ film which was selectively deposited in the contact hole, the plug is formed by selective Al—CVD. However, when the contact hole has a diameter of at most 0.8 μm, it is not always necessary to form the anti-diffusion film, as in the first preferred embodiment. Even in such a case, it is possible to obtain a contact structure having the good contact property.

In the above outlined second and third preferred embodiments of the method according to this invention, the silicide film of high melting point metal is subjected to the nitriding process to form the anti-diffusion film. Several embodiments of this nitriding process will now be explained.

FIGS. 9A to 9G are cross sections showing successive steps of a fourth preferred embodiment of the method of manufacturing the semiconductor device according to this invention. Also in the present embodiment, the contact structure serves to connect the drain diffusion region of the FET to the metal wiring.

As shown in FIG. 9A, a P well 43 is formed in a surface of a silicon substrate 41 and a field oxide film 42 is formed on the surface of the silicon substrate 41 for isolating electronic elements. A gate insulating film 44 made of silicon oxide and a gate electrode 45 made of polysilicon are also formed on the surface of the silicon substrate 41. After a side wall 46 is formed on a side surface of the gate electrode 45, arsenic impurities are diffused into the well 43 to form an N+ source region 47 and an N+ drain region 48. A depth of the junctions between these diffusion regions and the P well 43 is about 0.15 μm.

Then, a titanium silicide film 49 is formed on the polysilicon gate electrode 45 and the source and drain regions 47 and 48 by a well known titanium salicide process, as illustrated in FIG. 9B. A thickness of the titanium silicide film 49 is about 75 μm.

Next, as shown in FIG. 9C, a SiO$_2$ insulating film 50 having a thickness of 1.2 μm is formed on the surface of the silicon substrate 41. Then, a contact hole 51 is formed in the insulating film 50 by means of a well known photoetching process using photoresist, as shown in FIG. 9D. It should be noted that the titanium silicide film 49 is exposed at a bottom of the contact hole 51.

After removing the photoresist, the silicon substrate 41 is placed into a vacuum chamber and the exposed surface of the titanium silicide film 49 is subjected to the nitriding process to form a titanium nitride (TiN) film 52. In the present embodiment, the vacuum chamber is kept at a pressure of 50 torr and the substrate is rapidly heated to 700° C. for one minute in an atmosphere of monomethylhydrazine. The thus formed titanium nitride film 52 has a thickness of 5 nm or more. This thickness is sufficient for suppressing the reaction of the titanium silicide with aluminum. That is, the titanium nitride film 52 effectively functions as an anti-diffusion film.

After performing the nitriding process outlined above, the silicon substrate 41 is introduced into a vacuum chamber for forming the aluminum film. In this chamber, DMAH gas is flowed over the surface of the silicon substrate 41. Thus, an aluminum plug 53 is selectively deposited in the contact hole 51 by the selective Al—CVD, as depicted in FIG. 9F. Next, an Al—Cu alloy film having a thickness of 0.9 μm is formed on the insulating film 50 such that the Al—Cu alloy film is connected to the aluminum plug 53. Then, the Al—Cu alloy film is patterned to form an Al—Cu alloy wiring 54, as shown in FIG. 9G. After heating in hydrogen at 450° C. for 30 minutes, the contact property was measured.

In the present embodiment, the nitriding process is carried out by using monomethylhydrazine. According to this invention, titanium silicide may be changed into titanium nitride by using other nitrogen-containing gases, such as ammonia, hydrazine and alkylhydrazine. It has been experimentally confirmed that it is possible to obtain good results by rapidly heating the substrate in an atmosphere containing ammonia to a temperature within a range from 800° C. to 900° C. for a time not longer than 60 seconds under a reduced pressure of 50 torr.

Particularly, when the substrate is heated to a temperature above 850° C., it is possible to form the titanium nitride film 52 which effectively serves as an anti-diffusion film. Thus, the reaction between the titanium silicide and aluminum is effectively prevented. Furthermore, when a high frequency plasma is generated by nitrogen or ammonia, a similar excellent effect is obtained by heating the substrate at a lower temperature, within a range from 300° C. to 450° C.

In this case, the vacuum chamber was kept at a pressure of between 1 torr and 100 torr, inclusive. It has been further confirmed that a thickness of the TiN film 52 can be adjusted by controlling the heating temperature and time, and when a thickness of TiN film is not less than 2 nm, and preferably not less than 5 nm, it is possible to obtain a sufficient anti-diffusion effect. In this case, it is sufficient for forming the titanium silicide film with a thickness not less than 25 nm. Therefore, the above-outlined thicknesses of the titanium silicide film 49 and the titanium nitride film 52 are sufficient to prevent the diffusion of aluminum.

In the above outlined fourth preferred embodiment of the method of this invention, the surface of the silicide film 49 exposed at the bottom of the contact hole 51 is changed into a nitride film 52 after the formation of insulating film 50 and the contact hole 51. However, according to this invention, it is also possible to change the surface of the silicide film 49 before the formation of the insulating film 50 or the contact hole 51.

In this case, however the nitriding condition should be modified to increase the thickness of the nitride film 52, because some of the nitride film 52 will be etched away during the dry etching process used to form contact hole 51. Moreover, the resistance of the source and drain regions 47 and 48 increases because the thickness of the silicide film 49 between the contact plug 53 and channel regions of the MOSFET is decreased due to the nitriding treatment.

FIG. 10 is a graph showing a relationship between a thickness of the TiSi$_2$ film 49 and a contact leak current, as the thickness of the TiN film 52 is varied. From FIG. 10, it can be understood that the contact leak current is greatly dependent upon the thickness of the TiN film 52 and the TiSi$_2$ film 49. When no TiN film 52 is formed, a rather large contact leak current is produced.

However, when the TiN film 52 is formed, the contact leak current can be reduced even if the TiN film 52 is very thin. Particularly, when the TIN film 52 having a thickness larger than 2 nm is formed, the contact leak current can be reduced remarkably by forming the TiSi$_2$ film having a thickness larger than 25 nm. It should be noted that the maximum thickness of the TiN film 52 depends upon the thickness of the TiSi$_2$ film 49. Generally, the maximum thickness of the TiN film 52 is about 50 nm.

FIG. 11 is a graph representing the number of aluminum nucleation sites generated during CVD of Al, and the resulting loss of selectivity of the Al deposition on the insulating film, in cases of no treatment, treatments with hydrazine, ammonia and plasma ammonia. It has been confirmed that the loss of selectivity could be substantially completely avoided by the nitriding treatment. It is considered that the dangling bonds existing on the surface of the insulating film are terminated by the nitriding treatment. However, an amount of oxygen during the nitriding treatment must be smaller than 1 ppm. Otherwise, when the oxygen amount exceeds 1 ppm, the generation of aluminum nucleation sites is increased.

FIGS. 12A to 12G are cross-sectional views illustrating the successive steps of a fifth preferred embodiment of the method according to this invention. The steps shown in FIGS. 12A and 12B are the same as those of the third preferred embodiment shown in FIGS. 8A and 8B, so that portion similar to those of the third preferred embodiment are denoted by the same reference numerals. In this fifth preferred embodiment, after forming the contact hole 51 in the insulating film 50 and removing the photoresist, the substrate is introduced into the vacuum chamber and a Ti film 60 having a thickness of 100 nm is formed on the surface of the substrate by a collimator sputtering method, as shown in FIG. 12C.

Next, the substrate is heated at 800° C. for thirty seconds in an atmosphere of nitrogen. Then, the unreacted titanium is removed with the aid of a mixture of sulfuric acid and hydrogen peroxide solution. In this manner, a titanium silicide film 61 is formed at a bottom of the contact hole 51, as shown in FIG. 12D.

Then, the silicon substrate 41 is introduced into the vacuum chamber and is rapidly heated in an atmosphere of monomethylhydrazine gas at a pressure of 10 torr. During this heating, the silicide film 61 is nitrided to form a titanium nitride film 62, as illustrated in FIG. 12E. The nitriding treatment is carried out at 700° C. for one minute under the pressure of 10 torr. Thus, the TiN film 62 having a thickness more than 5 nm is formed. This thickness is sufficient to prevent a reaction between the titanium silicide and the aluminum.

Next, the silicon substrate 41 is introduced into a vacuum chamber and DMAH gas is flowed over the surface of the silicon substrate 41 to form the aluminum plug 53 in the contact hole 51, as shown in FIG. 12F, by selective CVD using an organic aluminum compound gas. Then, an Al—Cu alloy film having a thickness of 0.9 μm is deposited on the insulating film 51. Then, the alloy film is patterned into a metal wiring 54 which is connected to the drain region 48 by the aluminum plug 53, the TiN film 62 and the TiSi$_2$ film 61. After performing a hydrogen heating treatment at 450° C. for thirty minutes, the contact property was measured. Then, it was confirmed that the contact structure can provide an excellent property, as in the fourth preferred embodiment.

FIGS. 13A to 13D are cross-sectional views showing successive steps of a sixth preferred embodiment of the method according to the invention. In the present embodiment, the contact structure serves to connect upper and lower metal wirings via a plug formed in a contact hole provided in an interlayer insulating film. A lower metal wiring 73 comprises a TiN film 71 having a thickness of 50 nm and an Al—Cu film 72 having a thickness of 800 nm. An interlayer insulating film 74 is formed on the lower metal wiring 71.

Then, a contact hole or via hole 75 is formed in the insulating film, as shown in FIG. 13A. At a bottom of the contact hole 75, the TiN film 71 is exposed. Next, after removing a photoresist, the substrate is introduced into a vacuum chamber and is subjected to a surface treatment or nitriding treatment in an ammonia plasma. The surface treatment is carried out at 350° C. under a pressure of 0.5 torr, while the ammonia gas is activated with 300 W RF power having a frequency of 13.56 MHZ.

Next, the substrate is placed into a vacuum chamber for forming an aluminum plug 76. In this vacuum chamber, a DMAH gas is flowed over the substrate and aluminum is selectively deposited in the contact hole 75 to form the aluminum plug 76, as shown in FIG. 13B. Then, an Al—Cu alloy film 77 having a thickness of 0.9 μm is deposited on the interlayer insulating film 74, as illustrated in FIG. 13C. This Al—Cu alloy film is patterned to form an upper wiring 77 which is connected to the lower metal wiring 71 by the aluminum plug 76. After performing a hydrogen heating treatment at 450° C. for 30 minutes, the contact property was measured. It has been found that the contact structure of the present embodiment also has a good property.

In this sixth preferred embodiment, the nitriding process is carried out by using an activated ammonia plasma. According to this invention, the nitriding treatment may be performed at 400° C. in an atmosphere of monomethylhydrazine. In this case, the TiN film 71 exposed at the bottom of the contact hole 75 is not changed into titanium nitride. Rather, the surface of the interlayer insulating film 74 and an inner wall of the contact hole 75 are subjected to the nitriding treatment, so that the selectivity of the selective Al CVD process is improved. In this description, such a surface treatment is also called the nitriding treatment although the exposed surface of the TiN film 71 is not nitrided.

It is also possible to use a titanium or a titanium silicide film in place of the TiN film 71. In this case, the surface of the titanium or titanium silicide film is changed into a titanium nitride.

In the embodiments so far explained, the contact structure is applied to the diffusion region formed in the surface of the silicon substrate. However, this invention may be used to form a connection to another conductive region, such as a gate electrode of MOSFET. FIGS. 14, 15 and 16 are cross-sectional views of the center of the gate electrode showing several embodiments of such a modification.

In FIG. 14, a gate electrode 81 is formed from highly doped polysilicon and an insulating film 82 is applied on a surface of a silicon substrate 83. A contact hole 84 is formed in the insulating film 82. A silicide film 85 and a nitride film 86 of a high melting point metal are formed at the bottom of the contact hole 84. A remaining space of the contact hole 84 is filled with an aluminum plug 87. A metal wiring 88 containing aluminum is formed on the insulating film 82. The metal wiring 88 is connected to the plug 87. The contact structure of this first preferred gate electrode embodiment may be manufactured by the method similar to that shown in FIGS. 8A to 8D.

In a second preferred gate electrode embodiment, as shown in FIG. 15, the gate electrode is formed of a highly doped polysilicon film 81. A silicide film 89 of a high melting point metal is applied on the polysilicon film 81. Therefore, the silicide film 89 is exposed at a bottom of the contact hole 84 formed in the insulating film 82. Then, the nitriding treatment is performed to change the exposed surface of the silicide film 89 into a nitride film 90 of high melting point. After that, the aluminum plug 87 is formed in the contact hole 84 by selective Al—CVD. This method is similar to that illustrated in FIGS. 9A to 9G.

FIG. 16 shows a third preferred gate electrode embodiment, in which a gate electrode 91 is formed a silicide film of a high melting point metal, such as $WSi_x$, $MoSi_x$ and $TaSi_x$. After forming the contact hole 84 in the insulating film 82, a $TiSi_x$ film is selectively deposited on the surface of the silicide film 91 exposed at the bottom of the contact hole 84. Then, all of the deposited $TiSi_x$ film is changed to a TiN film 92. After that, an aluminum plug 87 is formed in the contact hole 84 by selective Al—CVD.

In this third preferred gate electrode embodiment, the silicide film is itself the conductive region on the gate insulating film. Furthermore, all of the $TiSi_x$ film deposited in the contact hole is changed to the TiN film 92. However, according to this invention, it is also possible that a bottom portion of the TiSi, film remains unchanged.

Note that, as shown in FIGS. 14, 15 and 16, the contact holes 84 are not formed above the gate insulating films but above the field oxide films. In recent MOS transistors, however, the contact holes are formed at positions very close to the gate insulating films to minimize the dimension of the devices. For example, the typical lateral distance from the edge of the field oxide and the center of the contact hole is 0.7 μm in devices with a 0.5 μm feature size. Aluminum atoms can move such a small distance in the silicide or polysilicon film in a very short time. So, the contact structures of this invention are essential to make semiconductor devices with good electrical characteristics.

When manufacturing an actual semiconductor device, a number of contact holes are simultaneously formed in the insulating film and are simultaneously filled with aluminum plugs by selective Al—CVD. In such a case, the contact holes may have different depths. Further, a surface of the insulating film is not planarized. In the methods according to this invention, even in such cases, the contact structures can be manufactured precisely and reliably. Several embodiments of such a method will now be explained.

FIGS. 17A to 17F are cross-sectional views illustrating successive steps of a seventh preferred embodiment of the method according to this invention. Note that the cross-sectional plane of FIGS. 17A to 17F is perpendicular to the cross-sectional plane of FIG. 15.

As shown in FIG. 17A, a relatively thick field oxide film 102 is formed on a surface of a silicon substrate or wafer 101 for isolating elements from each other. At a gate of each MOSFET, a thin gate oxide film 103 is formed. A polysilicon film 104 is deposited on the thin gate oxide film 103. A side wall 105 made of silicon oxide is formed on a side surface of the polysilicon film 104. Then, a source region 106 and a drain region 107 are formed by diffusion while the polysilicon film 104 and side wall 105 are used as a mask for the ion implantation. In this manner, the source and drain regions 106 and 107 are formed in a self-aligned manner. It should be noted that a well-known lightly doped drain (LDD) structure may be formed.

During the formation of the gate electrode 104 and side wall 105, another gate electrode, comprising a highly doped polysilicon film 108 and a side wall 109, is also formed on the field oxide film 102. Note that, as shown in FIG. 15, the gate electrode 108 extends on the gate oxide film 103 and the distance between the gate oxide film 103 and the contact hole 115 is small. Then, titanium silicide films 110, 111, 112 and 113 are formed on the surfaces of the polysilicon films 104 and 108, as well as on the surfaces of the source and drain regions 106 and 107, by a well known salicide method.

Then, a silicon oxide film having a thickness of 100 nm is formed on the surface of the silicon substrate 101, by CVD. Further, a EPSG (borophosphosilicate glass) film having a thickness of 1300 nm is formed. Then, the silicon substrate 101 is heated at a temperature of 800° C. for thirty minutes to obtain an insulating film 114. Since the surface of the substrate has protrusions and depressions, the surface of the insulating film 114 is not flat.

In order to flatten the surface of the insulating film 114, the surface is polished or etched by a well known chemical mechanical polishing (CMP) using a slurry containing potassium hydroxide (KOH). During this CMP process, the thickness of the insulating film 114 on the source and drain regions 106 and 107 is decreased to 1200 nm. This CMP has been described in U.S. Pat. No. 4,944,836.

Next, by using well known photographic and dry etching techniques, contact holes 115 and 116 are formed in the insulating film 114, as shown in FIG. 17B. Since the insulating film 114 has a varying thickness, these contact holes 115 and 116 have different depths. That is, the contact hole on the gate electrode 115 is smaller than that on the diffusion region 116. The titanium silicide films 111 and 113 are exposed at the bottoms of the contact holes 115 and 116, respectively.

Then, the silicon substrate 101 is subjected to an RTN process under an atmosphere of ammonia. The exposed surfaces of the titanium silicide films 110–113 at the bottoms of the contact holes 115 and 116 are thus changed into titanium nitride to form TiN films 117 and 118, respectively as illustrated in FIG. 17C. Then, by selective Al—CVD using DMAH gas, aluminum is selectively deposited on the TiN films 117 and 118 to form aluminum plugs 119 and 120 in the contact holes 115 and 116, respectively, as shown in FIG. 17D.

In this seventh preferred embodiment, this selective Al—CVD is carried out for such a time period that the deepest contact hole 116 is sufficiently filled with aluminum. Therefore, at a shallower contact hole 115, the aluminum plug 119 protrudes by about 0.4 μm over the surface of the insulating film 114. Then, the protruding aluminum plug 119 is removed by CMP using a slurry including hydrogen peroxide ($H_2O_2$) and phosphoric acid ($H_3PO_4$). This CMP method has been described in U.S. Pat. No. 5,209,816. In this manner, it is possible to obtain aluminum plugs 119 and 120 having surfaces which are completely flushed with the surface of the insulating film 114, as depicted in FIG. 17E.

Then, an aluminum alloy film is deposited on the insulating film 114 and is patterned into a desired shape to form metal wirings 121 and 122. The metal wiring 121 is connected to the gate electrode 108 by the plug 119. The other metal wiring 122 is connected to the drain region 107 by the plug 120.

In this seventh preferred embodiment, after flattening the insulating film surface, the contact holes 115 and 116 are formed. However, according to this invention, the contact holes may be formed prior to flattening the insulating film 114, the aluminum plugs 119 and 120 may be formed and then, the insulating film 114 may be flattened. In this case, the contact holes have the same depth prior to the formation of the aluminum plugs, so that the selective Al—CVD is performed such that all the contact holes are completely filled with aluminum. Then, the surface of the BPSG film 114 and aluminum plugs may be polished by CMP using a slurry containing acetic acid.

In some semiconductor devices, between a transistor and a metal wiring, other wirings may be formed, such as a highly doped polysilicon wiring; polycide wiring formed with a stack of a highly doped polysilicon film and a silicide film, such as $WSi_x$ film, $MoSi_x$ film, $TaSi_x$ film and $TiSi_x$ film; silicide wiring such as $WSi_x$ film, $MoSi_x$ film, $TaSi_x$ film and $TiSi_x$ film; metal compound wiring formed with, for example, TiN film; high melting point metal wiring formed with, for example, W film, Mo film and Ta film. The transistor, these wirings and the aluminum wirings are electrically isolated by insulating films in which contact holes are formed. These contact holes may be fully or partially filled with aluminum. When forming an aluminum plug for connecting the aluminum wiring to other wiring, a depth of a contact hole becomes even shallower compared to a contact hole for connecting a gate electrode and the aluminum wiring, so that the technique for polishing a top protruding portion of the aluminum plug is much more important.

FIGS. 18A to 18E are cross-sectional views showing successive steps of an eighth preferred embodiment of the method according to this invention. In this eighth preferred embodiment, portions similar to those of the previous embodiment are denoted by the same reference numerals used in FIGS. 17A to 17F and their detailed explanation is dispensed with.

After the forming field oxide film 102 and the gate oxide film 103 on the silicon substrate 101, a polysilicon film 131 having impurities doped therein and a thickness of 200 nm is deposited by CVD. Then, a Ti film 132 having a thickness of 30 nm and a TiN film 133 having a thickness of 70 nm are successively applied by sputtering. Finally, a silicon oxide film 134 having a thickness of 100 nm is deposited by CVD, as shown in FIG. 18A.

Then, the substrate is heated at a temperature of 750° C. for thirty seconds to react the Ti film 132 with the polysilicon film 131 to form a $TiSi_2$ film 135, as shown in FIG. 18B. Then, a stack of the poly-silicon film 131, the $TiSi_2$ film 135, the TiN film 133 and the $SiO_2$ film 134 is patterned by photolithography and dry etching to form gate electrodes 136 and 137, as shown in FIG. 18B. In this eighth preferred embodiment, the gate electrode 136 is formed on the surface of the field oxide film 102 and the gate electrode 137 is provided on the surface of the silicon substrate 101. After depositing a silicon oxide film on the substrate, the side walls 138 are formed on the side surfaces of the gate electrodes 136 and 137 by dry etching.

On a whole surface of the silicon substrate 101, a $WSi_x$ film 139, where x=2.7, is formed by sputtering. After that, dopants are introduced into the $WSi_x$ film by ion implantation. Next, a TiN film 142 having a thickness of 70 nm is deposited on the $WSi_x$ film 139 by sputtering. Then, a $SiO_2$ film 143 is deposited on the TiN film 142 by CVD. Then, a stack of the $WSi_x$ film 139, the TiN film 142 and the $SiO_2$ film 143 is patterned by photolithography and dry etching. Finally, the substrate is heated at 850° C. for thirty minutes to diffuse the dopants into the silicon substrate 102 to form a source region 140 and a drain region 141, as shown in FIG. 18C. This method of forming the source and drain regions has been disclosed by C. T. Liu et al. in "Technical Digest of 1993 international Electron Device Meeting", 1993, p. 93.

Next, an insulating film 114 is formed by CVD and CMP methods. Then, contact holes 115 and 116 are formed in the insulating film 114, as shown in FIG. 18D. This etching process is performed by using $CHF_3$ and $CF_4$ gases at a pressure of about 50 mtorr. The surfaces of the TiN films 133 and 142 are exposed at the bottoms of the contact holes 115 and 116, respectively. Then, DMAH is flowed over the surface of the silicon substrate 101 to selectively deposit aluminum plugs 119 and 120 in the contact holes 115 and 116, respectively. Finally, aluminum wirings 121 and 122 are formed on the insulating film 114, as illustrated in FIG. 18E.

In this eighth preferred embodiment, the TiN film 133 prevents the oxidation or nitridation of the titanium during the heating process to react with the polysilicon film. These films may also be formed by nitrides of a high melting point metal, such as WN, MON, ZrN, HfN and TaN, oxide nitrides of a high melting point metal, such as TiON, borides of a high melting point metal, such as TiB, and a high melting point metal in the Va and VIa groups of the periodic table, such as W, Mo, Nb and Ta.

The TiN film 142 on the $WSi_x$ film 139 prevents the out-diffusion of the dopants during heating for forming the source and drain regions. In this eighth preferred embodiment, the TiN film 133 is an anti-diffusion film and is formed all over the $TiSi_2$ film. Moreover, after forming the contact hole, it is possible to form the anti-diffusion film without performing processes which require temperatures above 500° C. Therefore, it is also possible to simultaneously form a contact structure for connecting a gate electrode or diffusion region to an upper metal wiring and a contact structure for connecting the lower and upper aluminum wirings.

In the embodiments so far explained, the contact structure for the diffusion region is formed just on the diffusion region. However, according to this invention, it is also possible to provide the contact structure for the diffusion region on the field oxide film. Such a ninth preferred embodiment will be explained with reference to FIGS. 19A to 19E.

As shown in FIG. 19A, after forming the field oxide film 102 and the gate oxide film 103 on the silicon substrate 101, a polysilicon film 131 having impurities highly doped therein and a thickness of 200 nm is deposited by CVD. Then, a $WSi_x$ film 151, where x=2.7, having a thickness of 150 nm is provided by sputtering. Finally, a silicon oxide film 134 having a thickness of 100 nm is deposited by CVD.

Then, a stack of the polysilicon film 131, the $WSi_x$ film 151 and the $SiO_2$ film 134 is patterned by well-known photolithography and dry etching to form the gate electrode 136 on the field oxide film 102 and a gate electrode 137 on the silicon substrate 101, as illustrated in FIG. 19B. Then, the side walls 138 made of silicon oxide are formed on side surfaces of the gate electrodes 136 and 137.

Next, a Ti film and an amorphous silicon film are deposited on the silicon substrate 101 by sputtering and dopants are implanted into the amorphous silicon film. Then, the amorphous silicon film is selectively removed by photolithography and dry etching. Then, the assembly is heated at 825° C. for thirty seconds to react the amorphous silicon with the Ti film to form a $TiSi_2$ film 152 having a thickness of 85 nm. Then, the unreacted Ti film is removed by using a mixture Of $H_2SO_4$ and $H_2O_2$.

After that, the assembly is heated at 850° C. for thirty minutes to form the source region 140 and drain region 141 in the surface of the silicon substrate 101, as shown in FIG.

19C. This method of forming the source and drain regions 140 and 141 has been described by T. Yoshida et al in "Extended Abstracts of 1993 International Conference on Solid State Devices and Materials", 1993, P. 567. It should be noted that the patterning is carried out such that the $TiSi_2$ film 152 extends on to the field oxide film 102.

Next, the insulating film 114 having a flat surface is formed on the silicon substrate 101. Then, the contact holes 115 and 116 are formed in the insulating film 114, as shown in FIG. 19D. During this process, the surface of the $TiSi_2$ film 152 is exposed at the bottom of the contact hole 116. Then, the assembly is subjected to an RTN process. The exposed surface of $TiSi_2$ film 152 is changed into a TiN film 153. Then, DMAH is flowed over the surface of the substrate to selectively deposit aluminum plugs 119 and 120 in the contact holes 115 and 116, respectively. Finally, aluminum wirings 121 and 122 are formed on the insulating film 114 as illustrated in FIG. 19E.

In this ninth preferred embodiment, the aluminum plug 120 is formed at a position remote from the diffusion region 141, so that the deterioration of the property due to the diffusion of the aluminum can be further reduced. However, if the TiN barrier film 153 is not formed at the bottom of the contact hole 116, aluminum atoms can be moved into the diffusion region 141 through the $TiSi_2$ film 152. Particularly, when the contact hole has an area larger than 0.7 $\mu$m, contact deterioration is remarkably detected.

Figure 22A:
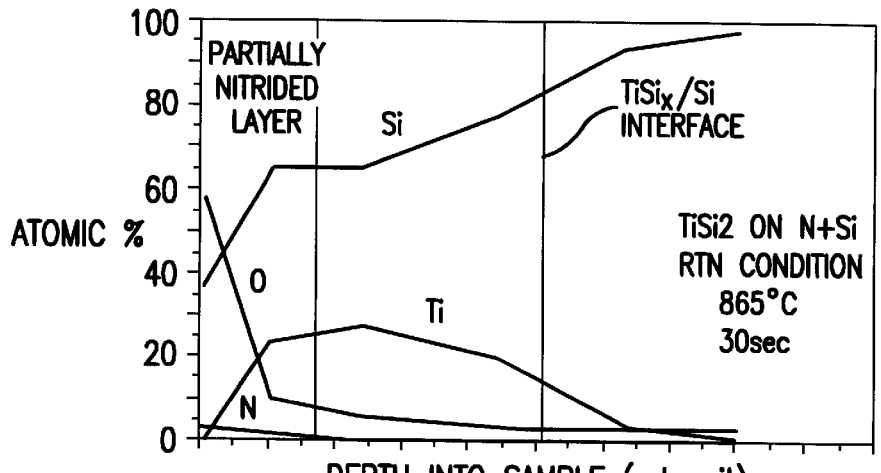
FIG. 22 is a series of graphs showing the electron spectroscopy for chemical analysis depth profiles of a $TiSi_2$ film subjected to rapid thermal nitridation.
Figure 22B:
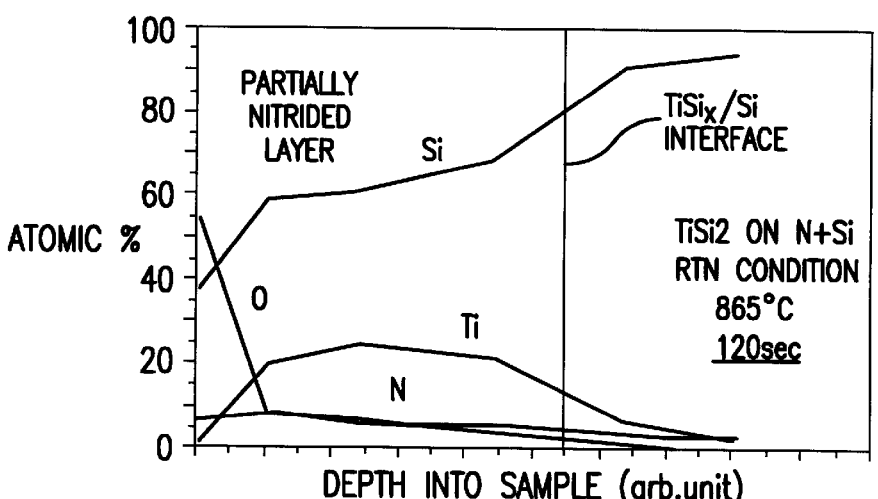
Figure 22C:
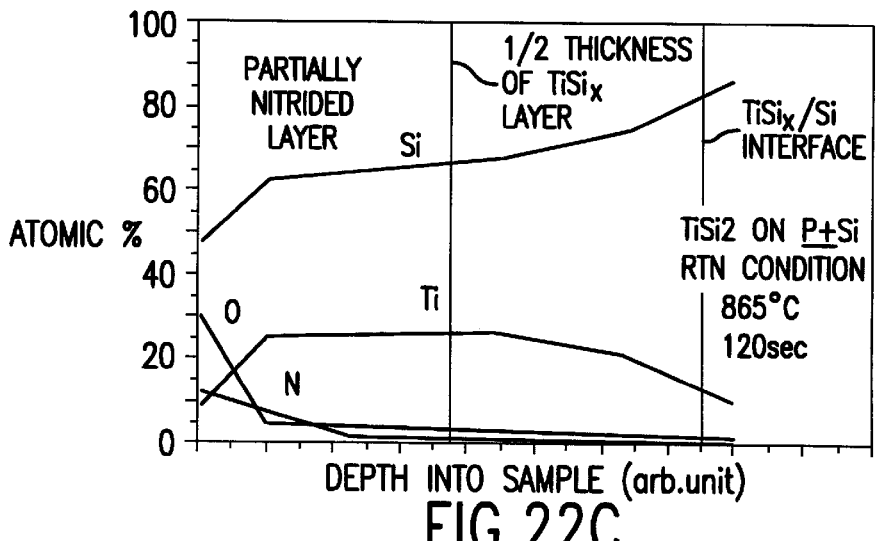
Figures 23A, 23B:
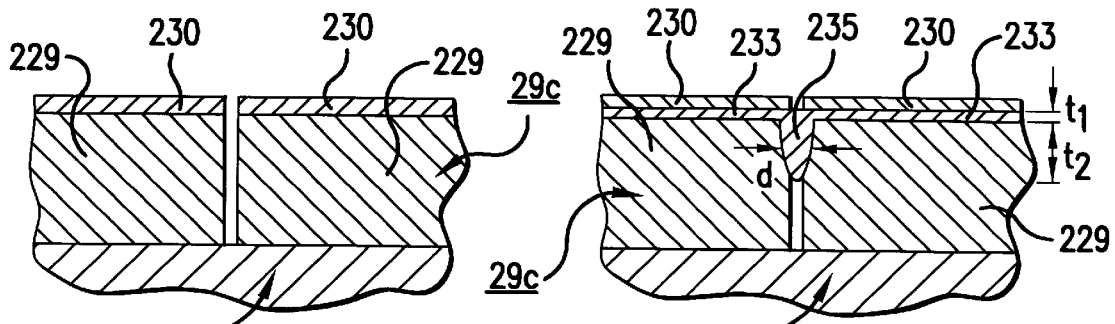
FIGS. 23A and 23B are cross-sectional views of the $TiSi_2$ film before and after nitridation.

In a further embodiment of the method for forming the contact structure shown in FIG. 7D, as shown in FIGS. 23A and 23B, rather than converting a top portion of the $TiSi_2$ film 29c to a relatively thick stoichiometric TiN film 35 when the $TiSi_2$ grains 229 of the $TiSi_2$ film 29c are subjected to rapid thermal nitridation (RTN), only the grain boundaries 235 of the $TiSi_2$ grains 229 of the $TiSi_2$ film 29c are nitrided. Thus, rather than forming a relatively thick TiN film 35 by nitriding the $TiSi_2$ film 29c by converting a significant portion of each $TiSi_2$ grain to TiN, as shown in FIG. 7D, in this further embodiment, a layer in which only the grain boundaries are substantially nitrided is formed. Surprisingly, as demonstrated in FIGS. 20–22C and 25–27, nitriding only the grain boundaries of the $TiSi_2$ film forms an anti-diffusion barrier which prevents the diffusion of aluminum through the $TiSi_2$ film 29c as effectively as the relatively thick TiN film 35 shown in FIG. 7D.

In the following experiments, the $TiSi_2$ film was formed by the salicide process. That is, the $TiSi_2$ film was formed by a direct reaction of the sputter deposited Ti film and the Si substrate by heating at 650° C. for 30 seconds. The unreacted Ti was selectively removed by an $H_2SO_4+H_2O_2$ solution. The $TiSi_2$ film was then annealed at 800° C. for 30 seconds before nitridation. By this second heat treatment, the $TiSi_2$ grains changed from their low temperature phase (C49 phase) to their high temperature phase (C54 phase). After the second heat treatment, the $TiSi_2$ grains had diameter of about 0.2 $\mu$m–0.5 $\mu$m. The thickness of the $TiSi_2$ film is about 30 nm–60 nm. Since the average diameter of the $TiSi_2$ grains was larger than the thickness of the $TiSi_2$ film, the grains usually extended from the surface of the $TiSi_2$ film to the interface between the $TiSi_2$ film and the Si substrate.

FIG. 20 shows the change in the sheet resistance as a function of the process temperature of the rapid thermal nitridation of the $TiSi_2$ film 29c. As shown in FIG. 20, the sheet resistance increases at temperatures higher than 865° C. corresponding to the nitridation of the $TiSi_2$ film 29c. Assuming that $TiSi_2$ has a resistivity of 20 $\mu\Omega$cm, and TiN has a resistivity of 150 $\mu\Omega$cm, the thickness of the TiN film formed by RTN at 865° C. is approximately 0.5 nm and the thickness of the TiN film formed by RTN at a temperature of 900° C. is approximately 3 nm–4 nm. The $TiSi_2$ film 29c is approximately 30 nm thick.

Figure 21:
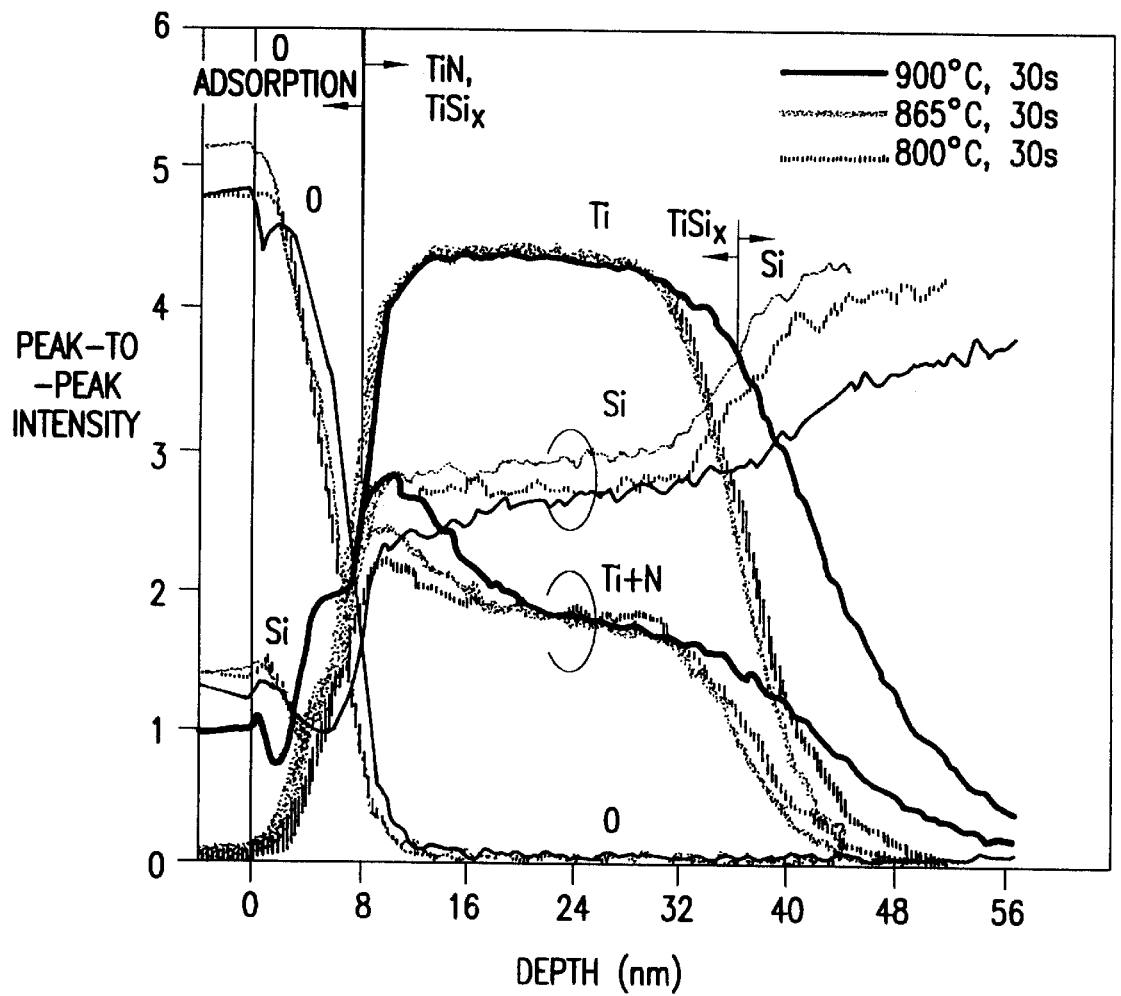
FIG. 21 is a graph showing the auger electron spectroscopy profiles for a $TiSi_2$ film which has been subjected to rapid thermal nitridation.

FIG. 21 is an Auger electron spectroscopy (AES) in-depth profile of the $TiSi_2$ film 29c after being treated by a RTN process at a $NH_3$ ambient atmosphere for 30 seconds at process temperatures of 800° C., 865° C., and 900° C., respectively. As shown in FIG. 21, the first 8 nm of the profile included a large proportion of oxygen (O). This extra oxygen observed at the surface of the sample was incorporated mainly due to oxygen absorption and slight oxidation during the storage of the sample in air before the AES analysis. That is, the surface of $TiSi_2$ film 29c begins at a depth of around 8 nm in this profile. Since the sample is normally transferred to the next processing apparatus as soon as the nitridation process is completed, this oxygen content is merely an artifact of the analysis.

As further shown in FIG. 21, the maxima of Ti+N peak-to-peak intensity was also approximately at the surface of the $TiSi_2$ film 29c, or at a depth of 8 nm to 10 nm in the profile. Furthermore, the nitrogen profiles in the nitrided $TiSi_2$ film 29c were dependent on the nitridation temperature. The rise in the peak-to-peak intensity of the Ti+N peak was due to the rising process temperature of the RTN process. That is, the higher nitridation temperature led to a higher nitrogen content.

However, as shown in FIG. 21, although the nitrogen content at approximately 8 nm to 10 nm increased with rising temperature, the Ti+N peak for all three process temperatures gradually dropped to approximately the same level at a depth of approximately 24 nm. Then, for each of the process temperatures, the Ti+N content rapidly drops off beyond a depth of 32 nm. In contrast, the titanium (Ti) content appears generally constant for the thickness of the $TiSi_2$ layer (i.e. between depths of 8 nm to 32 nm).

Thus, FIG. 21 suggests that some of the chemical bonds between titanium and silicon in the $TiSi_2$ film were converted to bonds between titanium and nitrogen by nitridation. The AES in-depth profile suggests the formation of a partially nitrated $TiSi_2$ layer within 10 nm to 20 nm (more specifically within about 10, 12 and 15 nm for the nitriding temperatures of 800°, 865° and 900° C., respectively) below the surface of the $TiSi_2$ film. However, the thickness of the TiN film estimated due to the change in the sheet resistance was far smaller than the partially nitrated $TiSi_2$ layer which was suggested by the AES in-depth profile.

Therefore, the inventors believe that the increase in the sheet resistance was not due to the formation of a stoichiometric TiN film. Rather, the increase in the sheet resistance was due to the formation of a partially nitrided layer, where the resistivity of the partially nitrided layer is considerably lower than that of a stoichiometric TiN film. A more in-depth discussion of FIG. 21 is given in "Self-Aligned Rapid Thermal Nitridation of $TiSi_2$ in $NH_3$ Ambient As a Diffusion Barrier Layer For Selective CVD—Al Contact Plug Formation", H. Shinriki et al., Jpn. J. Appl. Phys. Vol. 34, pgs. 992–996, February 1995, herein incorporated by reference.

Note that a sharp drop in the peak-to-peak intensities of the Ti signal and of the Ti+N signal between depths 32 nm to 40 nm in the spectra for the samples nitrided at 800° C. for 30 seconds and at 865° C. for 30 seconds suggest that the interface between the $TiSi_2$ film and the Si substrate is substantially flat. If a large amount of Ti is nitrided, the Si atoms which have been bonded to the nitrided Ti atoms diffuse to and segregate at the $TiSi_2/Si$ interface and make the interface rough. Also, these segregated Si atoms increase the contact resistance between the $TiSi_2$ film and the diffusion layer on the surface of the Si substrate. The inventors believe that the amount of nitrided Ti atoms was not large enough to roughen the interface and to increase the contact resistance at least at the nitriding condition of 800° C. for 30 seconds and 865° C. for 30 seconds.

FIG. 22A–22C shows depth profiles of Ti, Si, oxygen and nitrogen within the $TiSi_2$ film 29c after it was nitrided by the RTN process, as measured by electron spectroscopy for chemical analysis (ESCA). As shown in FIG. 22A, after nitridation of the $TiSi_2$ film 29c formed on an n+ diffused silicon substrate at 865° C. for 30 seconds, an increase in the nitrogen signal in the surface portion (about ⅓ of the thickness) of the $TiSi_2$ film 29c can be seen. This increased nitrogen signal corresponds to the existence of the partially nitrided layer, as shown in FIG. 21. FIG. 22B further shows that the partial nitridation of the $TiSi_2$ layer proceeded to the $TiSi_2/Si$ interface after the RTN process had proceeded for approximately 120 seconds. In FIG. 22B, the nitrogen concentration in the partially nitrided layer after 120 seconds of nitridation was slightly higher than the nitrogen concentration after thirty seconds of nitridation. However, as shown in FIG. 22B, the concentration remained far smaller than what would be expected for stoichiometric TiN. As also shown in FIG. 22C, the nitridation of the $TiSi_2$ film on a p+ diffused silicon substrate after nitridation at 865° C. for 120 seconds extended to a depth of about ½ of the thickness of the $TiSi_2$ film 29c.

Figure 28:
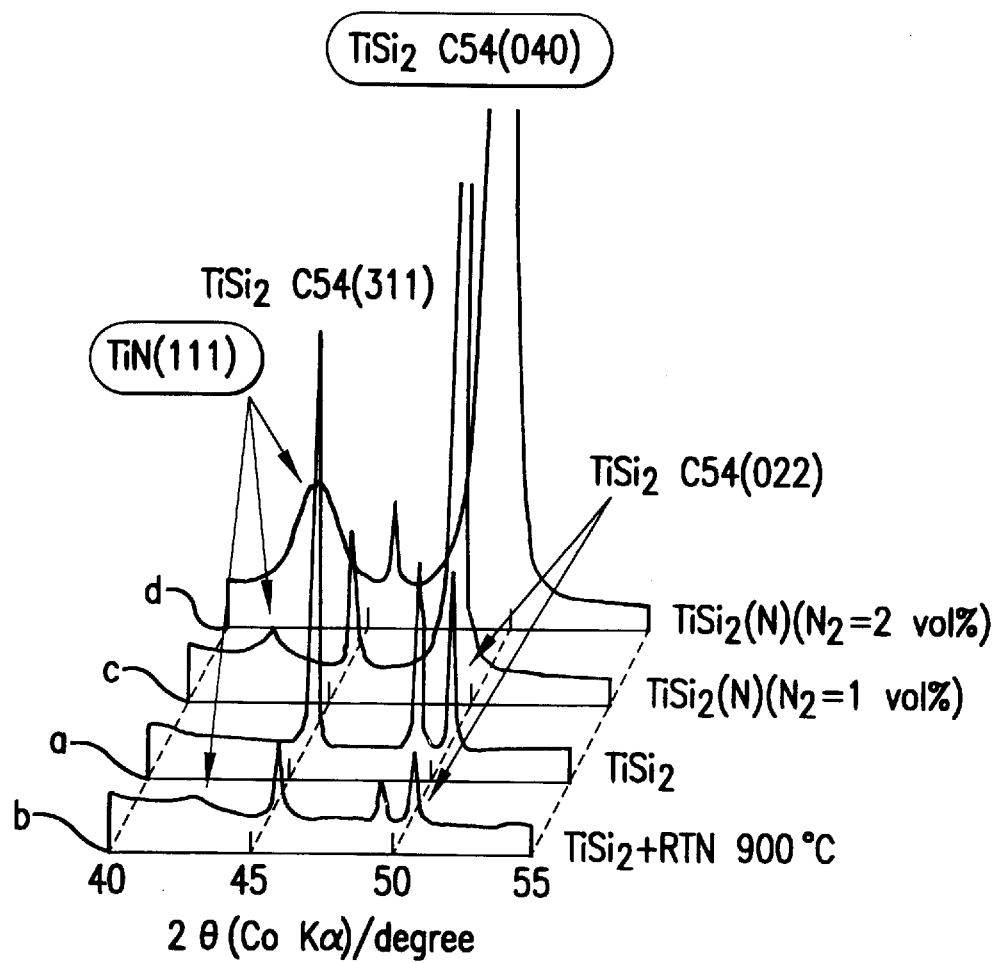
FIG. 28 is a graph of x-ray reflection diffraction spectra for four different $TiSi_2$ films.

FIG. 28 shows the x-ray reflection diffraction spectroscopy spectra for 4 samples: a) non-nitrided $TiSi_2$; b) $TiSi_2$ subjected to the process at 900° C. for 30 seconds; c) a $TiSi_2(N)$ film formed by sputtering in an argon and 1% nitrogen atmosphere; and d) a $TiSi_2(N)$ film formed by sputtering in an argon and 2% nitrogen atmosphere. As shown in FIG. 28, with respect to the non-nitrided $TiSi_2$ film, there is no TiN peak. In contrast, in the spectra for the $TiSi_2$ (N) film formed by sputtering, the film formed in the 1% nitrogen atmosphere has a significant TiN peak, while the film formed in the 2% nitrogen atmosphere has a very large TiN peak. In contrast, the nitrided TiN peak in the $TiSi_2$ film is very weak and broad. This weak and broad TiN peak suggests the formation of a small amount of fine TiN crystalline grains. In contrast, the narrow and sharp peaks of the $TiSi_2(N)$ films suggests formation of a large amount of large TiN crystal grains.

From these results, the inventors believe that the structure of the $TiSi_2$ of this embodiment is schematically shown in FIG. 23B. As shown in FIG. 23A, the $TiSi_2$ film 29c before nitridation consists essentially of the $TiSi_2$ grains 229, and the grain boundaries are very narrow. It should be appreciated that, in the experiments outlined above, the experimental samples are cleaned with $NH_3+H_2O_2$ solution before the RTN treatment. Therefore, the RTN treatment was conducted on $TiSi_2$ grains which have a thin (approximately 1 nm) surface oxidized layer 230. After nitridation, as shown in FIG. 23B, the $TiSi_2$ grains 229 of the $TiSi_2$ film 29c are nitrided from the grain boundaries. The wider "nitrided" grains boundaries 235 which include TiN are formed between the $TiSi_2$ grains 229. This is believed to be because $NH_3$ easily diffuses through the grain boundaries. The width "d" of the nitrided grain boundaries and the thickness $t_2$ of the layer in which the grain boundaries are nitrided, or the "grain-boundary-nitrided layer" are dependent on the nitriding condition. The resistivity of the grain-boundary-nitrided layer is lower than the resistivity of stoichiometric TiN and is approximately equal to the resistivity of $TiSi_2$, at least when the width of the nitrided grain boundaries is far narrower than the diameter of the grains.

Although it has not confirmed by the analysis, the inventors believe that the surface of the $TiSi_2$ grains were also nitrided and converted to a surface nitrided layer 233 below the oxidized layer 230, at least when the nitridation temperature was high (e.g., 900° C. for 30 seconds) or the nitridation time is long (e.g., 865° C. for 120 seconds). However, the thickness $t_1$ of the surface nitrided layer is believed to be very thin. That is, it is less than the in-depth resolution of AES analysis even at the nitriding condition of 900° C. for 30 seconds.

Figure 24A:
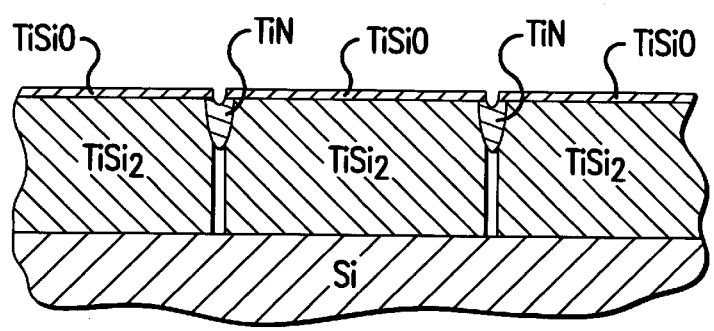
FIGS. 24A–24C are cross-sectional views of the $TiSi_2$ film after nitridation using a number of different nitridation conditions.
Figure 24B:
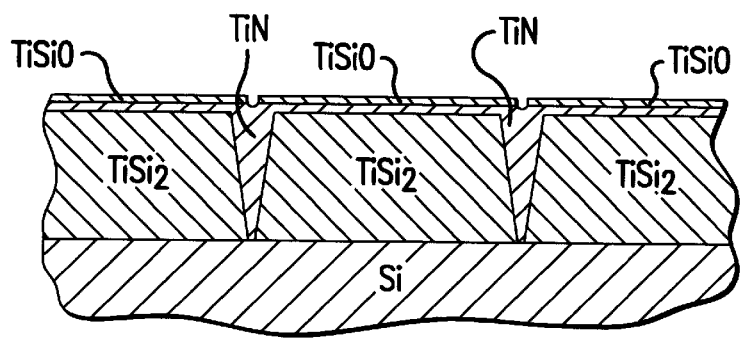
Figure 24C:
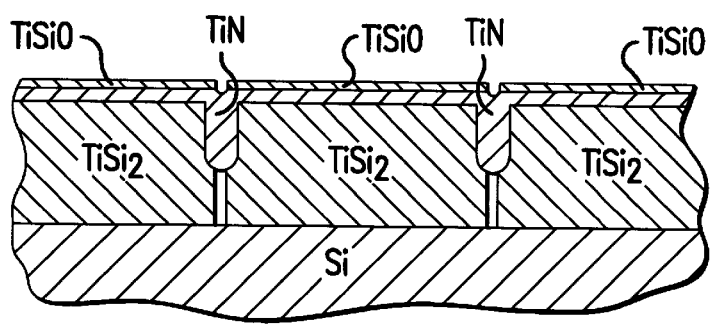

As shown in the ESCA spectra in FIG. 22A, at the nitriding condition of 865° C. for 30 seconds, the thickness $t_2$ in the $TiSi_2$ film 29c formed on an n+ Si substrate was about ⅓ of the total thickness of the $TiSi_2$ film, as shown in FIG. 24A. That is, the nitrided grain boundaries extended into only about ⅓ of the thickness of the $TiSi_2$ film. While, as shown in the ESCA spectra in FIG. 22B, at the nitriding condition of 865° C. for 120 seconds, the thickness $t_2$ in the $TiSi_2$ film 29c formed on the n+ Si substrate was approximately equal to the thickness of the $TiSi_2$ film. That is, the nitrided grain boundaries extended to the $TISi_2/Si$ interface, as shown in FIG. 24B. In addition, the width of the nitrided grain boundaries is increased. Further, as shown in the AES spectra in FIG. 21, when the nitriding temperature was increased from 865° C. to 900° C. at the nitriding time of 30 seconds, the nitrided grain boundaries extended slightly deeper into the $TiSi_2$ film and the width of the nitrided grain boundaries increased, as shown in FIG. 24C.

The width of the nitrided grain boundaries was estimated by the N signal intensity ratio in the ESCA spectra. The result was about 2–3% of the diameter of the grains at the near surface region of the $TiSi_2$ film on the n+ silicon substrate nitrided at 865° C. for 30 seconds. While the values were about 10% and about 3% of the diameter of the grains at the near surface and near interface regions, respectively, of the $TiSi_2$ layer on the n+ silicon substrate nitrided at 865° C. for 120 seconds. At least the values for the near surface regions are possibly over-estimated, because of the existence of the surface nitrided layer and a poor in-depth resolution of the ESCA analysis.

The thickness $t_1$ of the surface nitrided layer 233 has not been directly measured. However, if the formation of stoichiometric TiN film is assumed, the thickness of the surface nitrided layer must be smaller than the estimated thickness calculated by the change of the sheet resistance shown in FIG. 20, i.e., about 3 nm–4 nm, about 0.5 nm and even thinner, respectively, at the nitridation temperatures of 900° C., 865° C. and 800° C. for 30 seconds. It should be appreciated that the thickness $t_1$ is smaller than the thickness $t_2$ of the grain-boundary-nitrided layer. More specifically, if the thickness $t_2$ of the partially nitrided layer observed by the AES spectra shown in FIG. 21 (about 15 nm and 12 nm at the nitridation conditions of 900° C. and 865° C. for 30 seconds, respectively) is assumed to be equal to the sum of the thickness of the surface nitrided layer and the thickness of the grain-boundary-nitrided layer, the ratio of the thickness $t_2$ of the grain-boundary-nitrided layer and the thickness $t_1$ of the surface nitrided layer can be calculated to at least about 3 to 4, and at least about 20, at the nitridation conditions of 900° C. and 865° C. for 30 seconds, respectively.

Note that, in FIG. 24A, the surface nitrided layer is not shown because the inventors believe that the thickness of the surface nitrided layer is extremely thin, i.e., less than 0.5 nm.

Figure 25:
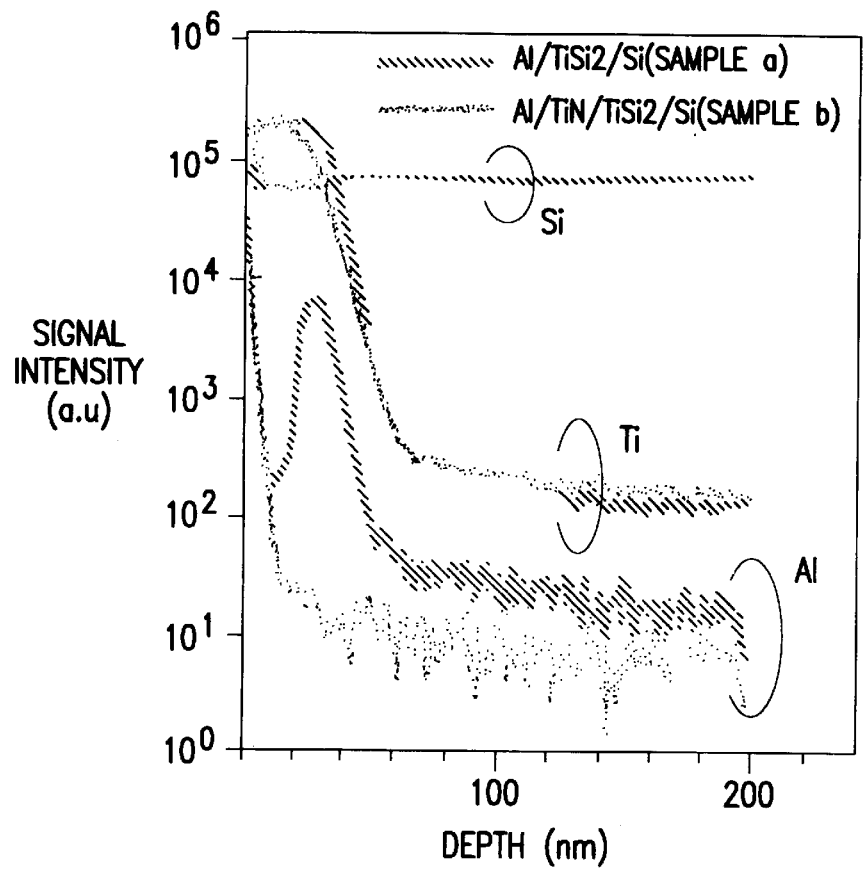
FIG. 25 is a graph showing the diffusion barrier properties using SIMS depth analysis.

FIG. 25 shows a secondary ion mass spectroscopy (SIMS) depth profile of two samples of the contact structure of this invention. A first sample used only a $TiSi_2$ film 29c formed over the Si substrate. In a second sample, the grain boundaries of the $TiSi_2$ layer 29c were nitrided at 900° C. for 30 seconds before the aluminum film was formed. In this experiment, the aluminum film was formed by CVD at a substrate temperature of about 210° C.–260° C. using DMAH as a source gas. The total pressure was 2 torr. DMAH gas was supplied by $H_2$ gas bubbling with a bubbler pressure of 100 torr. The SIMS analysis shown in FIG. 25 was performed after a heat treatment of 450° C. for 60 minutes in an inert ambient and after exposing the $TiSi_2$ layer by removing the aluminum film.

As shown in FIG. 25, for the non-nitrided sample, a large concentration of aluminum diffused into the $TiSi_2$ film and ultimately into the Si substrate. In contrast, in the grain-boundary-nitrided sample, essentially no aluminum diffused into either the $TiSi_2$ film or the Si substrate. The amount of aluminum was generally below the detection level of the SIMS apparatus. This suggests that, for the non-nitrided sample, the aluminum easily diffused through the $TiSi_2$ film along the grain boundaries, segregated at the interface between the $TiSi_2$ film and the Si substrate, and gradually diffused into the substrate. In contrast, because the grain boundaries in the grain-boundary-nitrided sample included TiN, the aluminum was unable to diffuse along the grain boundaries of the $TiSi_2$ film. Thus, no aluminum diffused into the Si substrate.

Figure 27:
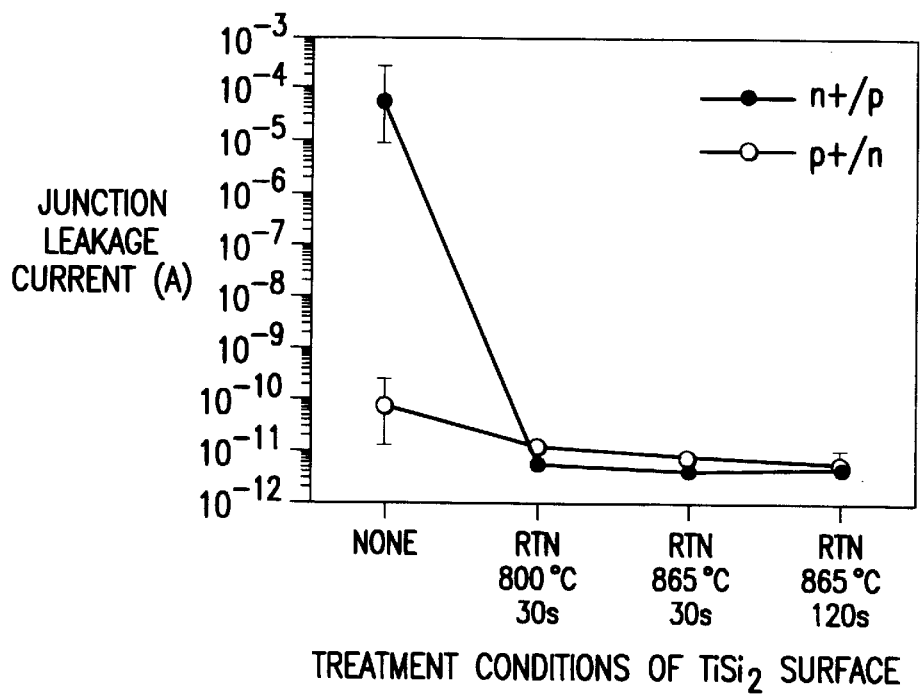
FIG. 27 is a graph showing the reverse-biased junction leakage current as a function of different nitridation conditions.
Figure 26:
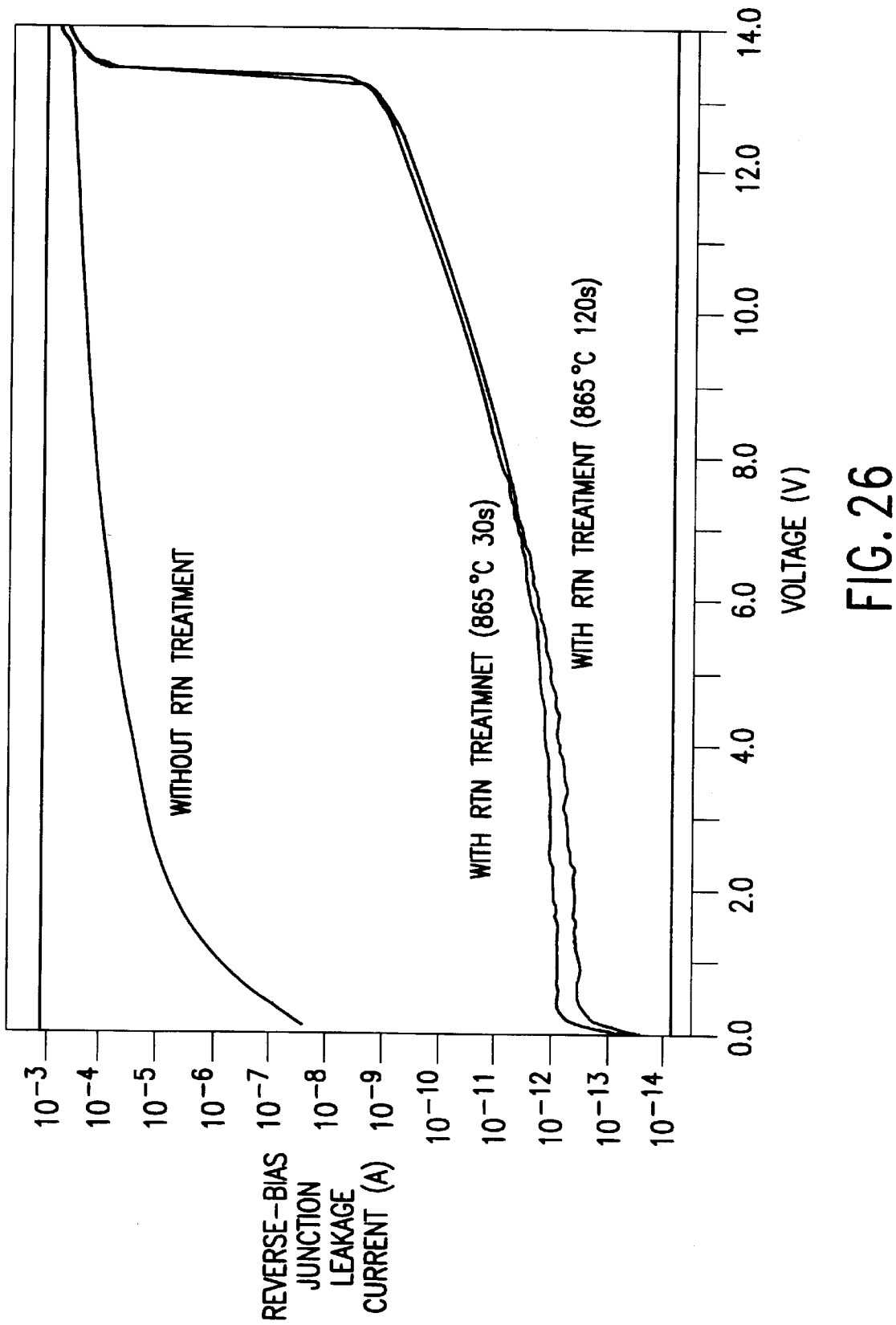
FIG. 26 is a graph showing the reverse-biased junction leakage current of the semiconductor device shown in FIG. 7D with and without nitriding the $TiSi_2$ film.

FIGS. 26 and 27 show the reverse-biased junction leakage current for each of the first and second samples outlined above with respect to FIG. 25. In this experiment, the aluminum plugs were formed in the contact holes of contact structures similar to those of FIG. 7B for the non-nitrided sample and 7D for the grain-boundary-nitrided sample. It was found that nitridation is effective to enhance the selective deposition of aluminum on the surface of the $TiSi_2$ film, and, at the same time, to suppress the deposition of aluminum on the surface and on the side wall of the insulating film. Due to these two effects, complete filling of the contact holes with aluminum plugs by the deposition only from the bottom surface of the contact holes is realized with substantially no deposition on the surface of the insulating film. The complete filling was confirmed even at the nitridation condition of 800° C. for 30 seconds, at which no significant change in the sheet resistance of the $TiSi_2$ film was detected. Further, the nitridation at 700° C. was also found to be effective to improve the selectivity.

After the plugs were formed, an aluminum copper alloy film was deposited by a sputtering method on the surface of the insulating film 30 as well as on the upper surface of the plug, and then patterned to form a metal wiring. The reverse-biased junction leakage current was measured after the samples were annealed at 450° C. for 30 minutes in an inert ambient. In the non-nitrided sample, as shown in FIG. 26, a reverse bias leakage current of $10^{-4}$ amps (A) was observed at 7 volts (V). In contrast, for the grain-boundary-nitrided samples, as shown in FIG. 26, the reverse-biased junction leakage current was below $10^{-11}$A at 7V. Thus, as shown in FIG. 26, the leakage current was greatly reduced by the grain-boundary-nitridation treatment.

Furthermore, as shown in FIG. 27, the junction leakage current at the reverse bias voltage of 7V in the $n^+/p$ junction which had not been nitrided ranged from $10^{-3}$A to $10^{-5}$A. In contrast, the junction leakage current of the grain-boundary-nitrided $n^+/p$ junction was below $10^{-11}$A, even at a nitridation condition of 800° C. for 30 seconds, at which no increase in the sheet resistance was observed, as shown in FIG. 20. The junction leakage current of a non-nitrided $p^+/n$ junction was considerably lower than that of the non-nitrided $n^+/p$ junction, and ranged from $10^{-9}$A to $10^{-11}$A. However, the junction leakage current of the $p^+/n$ junction was further reduced to about $10^{-11}$A by the grain-boundary-nitridation treatment.

The surface nitrided layer 233 of the nitrided $TiSi_2$ film may give additional anti-diffusion effect. However, if the surface nitrided layer is assumed to be a stoichiometric TiN film, the result of the sheet resistance measurement, as shown in FIG. 20, suggests that, at the nitriding condition of 800° C. for 30 seconds, the thickness of the surface nitrided layer 233 is less than a few tenths of a nanometer, or less than one monolayer. It is unlikely that such an extremely thin TiN film will have a sufficient anti-diffusion effect. The surface nitrided layer 233 is possibly a non-stoichiometric film, or a mixture of $TiSi_2$ and TiN, and has somewhat larger thickness. However, even in this case, the amount of the Ti—N bonds in the surface nitrided layer, which is considered to be effective to block the diffusion of aluminum, is extremely small.

From this consideration, the inventors believe that the grain-boundary nitrided layer itself has a sufficient anti-diffusion effect. That is, even though the anti-diffusion film formed by this experiment generally consists both of the surface nitrided layer and the grain-boundary-nitrided layer, it is also possible that the anti-diffusion film consists only of the grain-boundary-nitrided layer, as in the case of the nitridation at 800° C. for 30 seconds. It should also be appreciated that an additional optional step of removing the surface nitrided layer and/or the surface oxide layer can be performed before depositing the aluminum by CVD.

Accordingly, it appears that the diffusion of aluminum during Al—CVD and/or annealing generally occurs along the grain boundaries of the $TiSi_2$ film. Thus, nitriding only the grain boundaries of the $TiSi_2$ film is sufficient to effectively suppress the diffusion of aluminum through the $TiSi_2$ film. Furthermore, the grain-boundary nitrided $TiSi_2$ film has sufficient anti-diffusion effect even though the nitridation of the grain boundaries occurred only at the surface region of the $TiSi_2$ film, as when nitriding for 30 seconds at 865° C. While it is possible to form a near-stoichiometric TiN film, which is thick enough to effectively block the diffusion of aluminum, on the surface of the $TiSi_2$ film by changing the nitridation conditions, the anti-diffusion film formed by the grain-boundary-nitridation is advantageous because the increase in the sheet resistance of the $TiSi_2$ film is smaller. For this purpose, the nitridation condition should preferably be selected to keep the thickness of the surface nitrided layer small, or smaller than the thickness of the grain-boundary-nitrided layer.

The grain-boundary-nitridation is also advantageous because the roughness of the $TiSi_2$/Si interface is reduced. For this purpose, the nitridation condition should preferably be selected to keep the thickness of the surface nitrided layer small. The nitridation condition should also preferably be selected to keep the width of the nitride grain-boundary small and to keep the thickness of the grain-boundary-nitrided layer small.

It has not yet fully understood which parameters of the nitriding condition are effective to form the grain-boundary-nitrided structure. However, the inventors believe that nitridation in a reduced pressure $NH_3$ ambient, or more specifically, nitridation in an ambient with an $NH_3$ pressure of not higher than 100 torr, or further specifically, nitridation in an ambient with an NH₃ pressure of between about 10 to 100 torr, is effective to form the grain-boundary-nitrided structure.

It should also be appreciated that while any form of TiSi₂ is expected to work, C54-phase TiSi₂, which is stable and has a low diffusion coefficient in the grain, is considered the optimal phase of TiSi₂. The C54-phase TiSi₂ can be formed by the heat treatment before the nitridation. In addition, nitridation at 800° C. or higher is considered effective to change the phase of the TiSi₂ to C54-phase even though the heat treatment before the nitridation is skipped. Furthermore, a TiSi₂ film with relatively large grains and reduced total area for the grain boundaries, which can be formed by the heat treatment before the nitridation, is also considered to be an optimal structure for the TiSi₂ film. It should also be appreciated that the final structure of the nitrided TiSi₂ film is slightly different when the C54-phase TiSi₂ is formed during the nitridation.

In this invention, in the primary embodiments, only the portion of the TiSi₂ film which is exposed at the bottom of the contact hole is nitrided. This structure is advantageous because the selectivity of the Al—CVD is increased by the nitridation of the surface of the insulating film. However, it should be appreciated that it is also possible to conduct the nitriding treatment before forming the insulating film such that the anti-diffusion film, (i.e. the grain-boundary-nitrided TiSi₂ film) is formed on the entire surface of the TiSi₂ film. It is also possible to nitride the grain boundaries through the interface of the TiSi₂/Si interface by increasing the nitriding period to 120 seconds. In this case, the entire thickness of the TiSi₂ film is changed to an anti-diffusion film.

In addition to the lowered resistivity of the TiSi₂ film having only the grain boundaries nitrided, because the nitridation extends deeply into the TiSi₂ film along the grain boundaries, it is now possible to form the insulating film after forming the TiN film. When a stoichiometric TiN film is formed on the surface of the TiSi₂ film before the formation of the insulating film, it is difficult to adjust the thickness of the stoichiometric TiN film because the TiN film is etched during formation of the contact hole. That is, the TiN film at the bottom of the contact hole is likely to be locally removed and the anti-diffusion effect destroyed. However, since the nitridation of the grain boundaries of the TiSi₂ film extends deeply into the TiSi₂ film, it is now feasible to form the contact hole after the nitridation process because etching the insulating film to form the contact hole does not destroy the anti-diffusion effect of the grain-boundary-nitrided TiSi₂ film.

It should also be appreciated that silicides of other high melting point metals can be used. For example, CoSi₂ can also be formed by the salicide process. Thus, it should also be possible to nitride the grain boundaries of the CoSi₂ film. NiSi and PtSi can also be formed by the salicide process. Thus, nitriding the grain boundaries of these films should also be possible. However, it should be appreciated that the diffusion characteristics of these silicide films are probably different, as they are not disilicides and considered to have smaller grains. In addition, it would be necessary to determine the proper nitriding conditions at a lower temperature, i.e., less than 550° C., as these films transform at a higher temperature.

Other high melting point metal silicides such as WSi$_x$, MoSi$_x$ and TaSi$_x$ can be deposited by CVD and sputtering methods. These films have better, but not necessarily sufficient, anti-diffusion characteristics after high temperature (greater than 800° C.) heat treatment. Thus, by nitriding the grain boundaries of these films, it should be possible to effectively increase the anti-diffusion characters of these films. However, since these silicide films are harder to nitride, the nitriding condition should be adjusted accordingly. Since these films, when formed by sputtering, have small grains which are usually less than the thickness of the films, it is likely that only those grain boundaries between the grains which are exposed at the surface of the film will be nitrided.

It should also be appreciated that nitriding the grain boundaries is also applicable for some high melting point metal or high melting point metal alloy films, such as TiW. The tungsten grains in the TiW film are stable, similarly to the C54 grains of the TiSi₂ film. The Ti atoms at the grain boundaries at the TiW film should be easily nitrided, like the Ti atoms at the grain boundaries of the TiSi₂ film. In addition, tungsten may be replaced with other high melting point metals, such as Ta, Mo, Nb and V. Furthermore, titanium may be replaced by highly reactive metals such as Zr and Hf.

At least in this case, the grain-boundary-nitrided anti-diffusion film can be also used as an underlying film in the metal wiring formed on the surface of the insulating film. In such an application, an aluminum alloy film is deposited on the nitrided high melting point metal alloy film and the stacked film is patterned to form the metal wiring. The anti-diffusion film is effective to suppress the interdiffusion of aluminum and titanium, and to reduce the increase of the resistance of the metal wiring.

In this invention, as described above, aluminum was deposited by a selective Al—CVD process. Combination of the formation of an anti-diffusion film by nitriding the TiSi₂ film exposed at the bottom of the contact holes and the deposition of aluminum by selective Al—CVD is advantageous because the anti-diffusion film is formed only where necessary. However, aluminum can also be deposited by a non-selective Al—CVD process or by sputtering. In this case, an aluminum alloy film is simultaneously deposited in the contact holes and on the surface of the insulating film, and patterned to form a metal wiring. Alternatively, an underlying film, which can improve the deposition characteristics of the aluminum film, can be deposited prior to the deposition of the aluminum alloy film. It should also be appreciated that the nitrided TiSi₂ anti-diffusion film of this embodiment is also effective to suppress the diffusion of other metals, such as Cu, Ag or Au through the TiSi₂ layer. The film is also effective to suppress the diffusion of halogen atoms during CVD deposition of W, Mo or Ta.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A contact structure for use in a semiconductor device, comprising:

a conductive region formed on at least one of a junction formed in and a gate insulating film formed over a surface of a semiconductor substrate;

an anti-diffusion film comprising a high melting point metal formed over at least a portion of the conductive region, wherein the anti-diffusion film has grains and grain boundaries between the grains, wherein only the grain boundaries of the anti-diffusion film are substantially nitrided; and a metal wiring contacting at least a portion of the anti-diffusion film, the metal wiring is electrically connected to the conductive region by at least the anti-diffusion film.

2. The contact structure according to claim 1, wherein the anti-diffusion film comprises a silicide of the high melting point metal.

3. The contact structure according to claim 2, wherein the silicide is a disilicide of the high melting point metal and has a C54 phase.

4. The contact structure according to claim 3, wherein the high melting point metal is titanium.

5. The contact structure according to claim 1, further comprising:

an insulating film formed over the conductive region; and a contact hole in the insulating film, wherein at least a portion of the anti-diffusion film is exposed at a bottom of the contact hole;

wherein the metal wiring further comprises a plug formed in the contact hole, the plug contacting the exposed portion of the anti-diffusion film.

6. The contact structure according to claim 5, wherein the plug comprises aluminum.

7. The contact structure according to claim 5, wherein the anti-diffusion film is formed only at the bottom of the contact hole.

8. The contact structure according to claim 1, further comprising:

an insulating film formed over the conductive region; and a contact hole in the insulating film, wherein the anti-diffusion film is formed only at the bottom of the contact hole.

9. The contact structure according to claim 1, further comprising a film comprising the high melting point metal, wherein the anti-diffusion film is formed in a surface portion of the film.

10. The contact structure according to claim 1, wherein the metal wiring comprises aluminum.

11. The contact-structure according to claim 1, wherein:

the grains of the anti-diffusion film comprising a high melting point metal comprise a plurality of laterally adjacent grains forming a one-grain thick anti-diffusion film; and nitrided portions of the grain boundaries extend a substantial distance into the anti-diffusion film along the grain boundaries between the laterally adjacent grains.

12. The contact structure according of claim 11, wherein:

the anti-diffusion film is formed on the conductive region; and the nitrided portions of the grain boundaries extend through a thickness of the anti-diffusion film and contact the conductive layer.

13. A wiring structure for use in a semiconductor device, comprising:

a semiconductor substrate having a surface;

an anti-diffusion film formed over the surface of the semiconductor substrate, the anti-diffusion film comprising a grain-boundary-nitrided layer of a conductive material having grains and grain boundaries, the conductive material comprising one of a high melting point metal, a high melting point metal alloy, and a high melting point metal silicide, wherein only the grain boundaries between the grains of the conductive material are substantially nitrided to form the grain-boundary-nitrided layer; and a metal wiring formed on at least a portion of a surface of the anti-diffusion film.

14. The wiring structure according to claim 13, further comprising a surface nitrided layer formed on a surface of the grain-boundary-nitrided layer, wherein surfaces of the grains of the conductive material are substantially nitrided.

15. The wiring structure according to claim 14, wherein the grain-boundary-nitrided layer is thicker than the surface nitrided layer.

16. The wiring structure according to claim 14, wherein the grain-boundary-nitrided layer is at least about three times thicker than the surface nitrided layer.

17. The wiring structure according to claim 14, wherein a thickness of the surface nitrided layer is at most 4 nm.

18. The wiring structure according to claim 17, wherein a thickness of the surface nitrided layer is at most 0.5 nm.

19. The wiring structure according to claim 13, further comprising a conductive region formed on at least one of a junction formed in and a gate insulating film, formed over the surface of the semiconductor substrate, wherein the anti-diffusion film is formed over at least a portion of the conductive region and the metal wiring is electrically connected to the conductive region by at least the anti-diffusion film.

20. The wiring structure according to claim 19, wherein the metal wiring includes at least one of aluminum, copper, gold and silver.

21. The wiring structure according to claim 19, wherein the metal wiring includes at least one of tungsten, molybdenum and tantalum.

22. The wiring structure according to claim 16, further comprising:

an insulating film formed over the anti-diffusion film;

a contact hole formed in the insulating film, at least a portion of the surface of the anti-diffusion film exposed at a bottom of the contact hole;

wherein the metal wiring, comprises a plug formed in the contact hole, the plug contacting the exposed portion of the surface of the anti-diffusion film.

23. The wiring structure according to claim 22, wherein the plug comprises aluminum.

24. The wiring structure according to claim 22, wherein the anti-diffusion film is formed only at the bottom of the contact hole.

25. The wiring structure according to claim 19, further comprising:

an insulating film formed over the anti-diffusion film;

a contact hole formed in the insulating film;

wherein the anti-diffusion film is formed only at the bottom of the contact hole.

26. The wiring structure according to claim 19, further comprising a film of the conductive material formed on at least a portion of a surface of the conductive region, wherein the anti-diffusion film is formed in at least a portion of the film of the conductive material.

27. The wiring structure according to claim 26, wherein the conductive material is the high melting point metal silicide.

28. The wiring structure according to claim 13, further comprising:

an insulating film formed over the semiconductor substrate and having a surface;

wherein the anti-diffusion film is at least a portion of an underlying film for the metal wiring, the metal wiring being formed over the surface of the insulating film.

29. The wiring structure according to claim 28, wherein the metal wiring includes at least one of aluminum, copper, gold and silver.

30. The wiring structure according to claim 13, wherein the anti-diffusion film includes the grain-boundary-nitrided layer of the high melting point metal silicide.

31. The wiring structure according to claim 30, wherein the high melting point metal silicide is a disilicide.

32. The wiring structure according to claim 30, wherein the high melting point metal disilicide has a high temperature phase.

33. The wiring structure according to claim 30, wherein the high melting point metal silicide is titanium disilicide.

34. The wiring structure according to claim 30, wherein the high melting point metal silicide is C54-phase titanium disilicide.

35. The wiring structure according to claim 13, further comprising a film of the conductive material, wherein the anti-diffusion film is formed in at least a portion of the film of the conductive material.

36. The wiring structure according to claim 35, wherein the anti-diffusion film is formed in an entire surface area of the film of the conductive material.

37. The wiring structure according to claim 35, wherein the anti-diffusion film is formed only in part of a surface of the film of the conductive material.

38. The wiring structure according to claim 35, wherein the anti-diffusion film is formed in an entire thickness of the film of the conductive material.

39. The wiring structure according to claim 35, wherein the-anti-diffusion film is formed only in part of a thickness of the film of the conductive material.

40. The wiring structure according to claim 29, wherein the anti-diffusion film is formed only in a surface portion of the thickness of the film of the conductive material.

41. The wiring structure according to claim 35, wherein an average diameter of the grains of the film of the conductive material is less than a thickness of the film of the conductive material.

42. The wiring structure according to claim 13, wherein the anti-diffusion film consists essentially of the grain-boundary-nitrided layer.

43. The wiring structure according to claim 13, wherein an average width of grain boundaries in the grain-boundary-nitrided layer is less than about 10% of an average diameter of the grains of the conductive material.

44. The wiring structure according to claim 41, wherein an average width of grain boundaries in the grain-boundary-nitrided layer is less than about 3% of an average diameter of the grains of the conductive material.

45. An anti-diffusion film having grains and grain boundaries formed between the grains, wherein only the grain boundaries of the anti-diffusion film are substantially nitrided, the anti-diffusion film being formed by the process of nitriding the anti-diffusion film at a pressure not higher than about 100 Torr.

46. The anti-diffusion film according to claim 45, formed by the process of nitriding the anti-diffusion film at about a pressure of between 10 and 100 Torr.

47. The anti-diffusion film according to claim 45, formed by the process of annealing the anti-diffusion film at a temperature between 800° C. and 900° C.

48. The anti-diffusion film according to claim 45, formed by the process of annealing the anti[di]ffusion film in an NH$_3$ ambient atmosphere.

49. A wiring structure for use in a semiconductor device, comprising:

a semiconductor substrate having a surface;

a conductive material film comprising a high melting point metal formed over the surface of the semiconductor substrate, the conductive material film having grains and grain boundaries between the grains; and a grain-boundary-nitrided layer formed in at least a portion of the conductive material film, wherein only the grain boundaries of the conductive material film in the grain-boundary-nitrided layer are substantially nitrided.

50. The wiring structure according to claim 49, further comprising a wiring including a metal formed on at least a portion of a surface of the conductive material film, wherein the grain-boundary-nitrided layer prevents diffusion of the metal through the grain boundaries of the conductive material film.

51. The wiring structure according to claim 49, wherein the grain-boundary-nitride layer is formed only in a portion of a thickness of the conductive material film.

52. The wiring structure according to claim 49, wherein the grain-boundary-nitride layer is formed only in a surface portion of the conductive material film.

53. The wiring structure according to claim 52, wherein at least some of the grains extend through substantially an entire thickness of the conductive material film.

54. The wiring structure according to claim 49, wherein the grains of the conductive material film include laterally adjacent grains; and nitrided portions of the grain boundaries extend a substantial thickness along the grain boundaries between the laterally adjacent grains.

55. The wiring structure according to claim 54, wherein the laterally adjacent grains extend substantially an entire thickness of the conductive material film.

56. The wiring structure according to claim 54, wherein an average size of the grains is larger than a thickness of the conductive material film.

57. The wiring structure according to claim 49, further comprising a diffusion layer formed in the surface of the semiconductor substrate, wherein the conductive material film is formed on at least a portion of the diffusion layer.

58. The wiring structure according to claim 49, further comprising a surface nitrided layer formed on a surface of the grain-boundary-nitrided layer.

59. The wiring structure according to claim 49, wherein the grains of the conductive material film are grains of a silicide of the high melting point metal.

60. The wiring structure according to claim 49, wherein the grains of the conductive material film are grains of the high melting point metal.

61. The wiring structure according to claim 49, wherein the grains of the conductive material film are grains of an alloy of the high melting point metal.

62. The wiring structure according to claim 59, wherein the grain boundaries of the conductive material film include nitride of the high melting point metal.

63. The wiring structure according to claim 49, further comprising a wiring including one of aluminum, copper, gold and silver formed on at least a portion of a surface of the conductive material film.

64. A wiring structure for use in a semiconductor device, comprising:

a semiconductor substrate having a surface;

an anti-diffusion film comprising a high melting point metal formed over the surface of the semiconductor substrate, the anti-diffusion film comprising grains and grain boundaries between the grains, wherein only the grain boundaries of the anti-diffusion film are substantially nitrided.

65. The wiring structure according to claim 64, further comprising a wiring comprising a metal formed on at least a portion of a surface of the anti-diffusion film, wherein diffusion of the metal through the grain boundaries is prevented by the nitrided grain boundaries.

66. The wiring structure according to claim 64, wherein the grains of the anti-diffusion film includes laterally adjacent grains.

67. The wiring structure according to claim 66, wherein the laterally adjacent grains extend substantially an entire thickness of the anti-diffusion film.

68. The wiring structure according to claim 66, wherein an average size of the grains is larger than a thickness of the anti-diffusion film.

69. The wiring structure according to claim 64, further comprising a wiring including one of aluminum, copper, gold and silver formed on at least a portion of a surface of the anti-diffusion film.

* * * * *

UNITED STATES PATENT AND TRADEMARK OFFICE
CERTIFICATE OF CORRECTION

PATENT NO. : 5,834,846

DATED : November 10, 1998

INVENTOR(S) : SEMICONDUCTOR DEVICE WITH CONTACT STRUCTURE AND METHOD OF MANUFACTURING THE SAME

It is certified that error appears in the above-indentified patent and that said Letters Patent is hereby corrected as shown below:

On the cover page, in between the lines "[22] Filed August 23, 1995" and "[51] Int. Cl. 6..................H01L 23/48; H01L 23/52;" insert the priority information as follows:

--[30] Foreign Patent Application Priority Date

Jan. 10, 1995 [JP] Japan.......................7-001865--.

Claim 19, line 3, after "film" delete ",".

Claim 22, line 7, after "wiring" delete ",".

Claim 39, line 2, after "the" delete "-".

Claim 40, line 1, change "29" to --39--.

Claim 44, line 1, change "41" to --13--.

UNITED STATES PATENT AND TRADEMARK OFFICE
CERTIFICATE OF CORRECTION

PATENT NO. : 5,834,846

DATED : November 10, 1998

INVENTOR(S) : SEMICONDUCTOR DEVICE WITH CONTACT STRUCTURE AND METHOD OF MANUFACTURING THE SAME

It is certified that error appears in the above-identified patent and that said Letters Patent is hereby corrected as shown below:

Claim 48, line 2, change "anti[di]fussion" to --anti-diffusion--.

Signed and Sealed this

Eleventh Day of January, 2000

Attest:

Q. TODD DICKINSON

*Attesting Officer*  *Acting Commissioner of Patents and Trademarks*